United States Patent
Ikeda et al.

(10) Patent No.: US 8,183,560 B2
(45) Date of Patent: May 22, 2012

(54) LIGHT-EMITTING DEVICE

(75) Inventors: Takeshi Ikeda, Otsu (JP); Tsuyoshi Tominaga, Otsu (JP); Kazunori Sugimoto, Otsu (JP); Kazumasa Nagao, Otsu (JP)

(73) Assignee: TORAY Industries, Inc., Tokyo (JP)

( * ) Notice: Subject to any disclaimer, the term of this patent is extended or adjusted under 35 U.S.C. 154(b) by 147 days.

(21) Appl. No.: 12/311,852

(22) PCT Filed: Oct. 15, 2007

(86) PCT No.: PCT/JP2007/070050
§ 371 (c)(1),
(2), (4) Date: May 11, 2009

(87) PCT Pub. No.: WO2008/047744
PCT Pub. Date: Apr. 24, 2008

(65) Prior Publication Data
US 2010/0108992 A1    May 6, 2010

(30) Foreign Application Priority Data
Oct. 16, 2006 (JP) ................................ 2006-281425

(51) Int. Cl.
*H01L 35/24* (2006.01)
(52) U.S. Cl. ............... 257/40; 257/103; 257/E51.028; 257/E51.026; 257/E51.027; 549/59
(58) Field of Classification Search .............. 257/40, 257/103, E51.028, E51.026, E51.027; 549/59
See application file for complete search history.

(56) References Cited

U.S. PATENT DOCUMENTS

| | | | |
|---|---|---|---|
| 6,921,589 B2 * | 7/2005 | Kohama et al. | 428/690 |
| 2002/0160227 A1 * | 10/2002 | Kohama et al. | 428/690 |
| 2003/0027016 A1 * | 2/2003 | Ara et al. | 428/690 |
| 2003/0137241 A1 | 7/2003 | Fujita et al. | 313/504 |
| 2005/0208327 A1 | 9/2005 | Begley et al. | 428/690 |
| 2005/0221120 A1 | 10/2005 | Owczarczyk et al. | 428/690 |
| 2005/0280008 A1 | 12/2005 | Ricks et al. | 257/79 |
| 2007/0170421 A1 * | 7/2007 | Liao et al. | 257/40 |

FOREIGN PATENT DOCUMENTS

| | | |
|---|---|---|
| CN | 1394835 | 2/2003 |
| EP | 1 000 998 A1 | 5/2000 |
| EP | 1 148 109 A2 | 10/2001 |
| JP | 2002-008867 A | 1/2002 |
| JP | 2003-012676 A | 1/2003 |
| JP | 3389888 B2 | 1/2003 |
| JP | 2003-338377 A | 11/2003 |
| JP | 2004-200162 A | 7/2004 |
| JP | 2004-311030 A | 11/2004 |
| JP | 2005-60459 A | 3/2005 |
| JP | 2005-154534 A | 6/2005 |
| JP | 2006-049716 A | 2/2006 |
| JP | 2006049716 A * | 2/2006 |
| JP | 2006-073809 A | 3/2006 |
| JP | 2006-245172 A | 9/2006 |
| JP | 2006245172 A * | 9/2006 |
| WO | 2005/075600 A1 | 8/2005 |
| WO | 2005/093008 A1 | 10/2005 |
| WO | 2005/100507 A1 | 10/2005 |
| WO | 2006/009612 A1 | 1/2006 |

OTHER PUBLICATIONS

Tang, C.W. et al., "Organic electroluminescent diodes", Applied Physics Letters, vol. 51, No. 12, pp. 913-915 (1987).
Information Statement dated Jan. 31, 2011, filed in Japanese Patent Application No. 2007557674, and English translation thereof.
Communication dated Sep. 27, 2011, from JPO issued in JP Patent Appln. No. 2007-557674 including third party submission filed Sep. 9, 2011 (and English translation).
Chinese Office Action dated Oct. 25, 2010, issued in Chinese Patent Application No. 2010102001679630, and English translation thereof.
European Search Report dated May 20, 2011, issued in European Patent Application No. 07829784.3-1235.
Communication dated Sep. 30, 2011, from EPO issued in EP Appln. No. 07829784.3-1235.

* cited by examiner

*Primary Examiner* — Tu-Tu V Ho
(74) *Attorney, Agent, or Firm* — Kubovcik & Kubovcik

(57) ABSTRACT

The present invention provides a light emitting device comprising at least an emissive layer existing between an anode and a cathode, which emits light by means of electric energy. The light emitting device contains a compound having a pyrromethene skeletal structure with a specific structure or a metal complex thereof and a naphthacene derivative, and thus the light emitting device has high luminance efficiency and excellent durability.

3 Claims, No Drawings

LIGHT-EMITTING DEVICE

This application is a 371 of international application PCT/JP2007/070050, filed Oct. 15, 2007, which claims priority based on Japanese Patent Application No. 2006-281425 filed Oct. 16, 2006, which is incorporated herein by reference.

TECHNICAL FIELD

The present invention relates to a device comprising at least an emissive layer existing between an anode and a cathode, which emits light by means of electric energy.

BACKGROUND ART

There has recently been considerable research into organic thin-film light emitting devices comprising an emissive layer containing an organic fluorescent body existing between an anode and a cathode, which emit light when electrons injected from a cathode and holes injected from an anode recombine within an organic fluorescent body interposed between the cathode and the anode. Such light emitting devices are a focus of attention on account of their characteristics of thin shape, high luminance at a low driving voltage and polychromic light emission based on suitable selection of the fluorescent materials.

Numerous research organizations have been carrying out such research since C. W. Tang and co-workers at Kodak first described the fact that an organic thin-film light emitting device emits light of high luminance. A typical organic thin-film light emitting element construction proposed by the Kodak research group is that in which there are provided, in turn, on an ITO glass substrate, a hole transporting diamine compound, tris(8-hydroxyquinolate)aluminum(III) as the emissive layer and Mg:Ag as the cathode. A 1,000 cd/m² green light emission is possible at a driving voltage of about 10 V (refer to Non-Patent Document 1).

One of largest problems associated with organic thin-film light emitting devices is to improve durability and luminance efficiency of the device. There is known a method of forming an emissive layer by doping a host material with several % of a dopant material as means for obtaining a high-efficiency light emitting device. High carrier mobility and uniform film forming properties are required for the host material, while high fluorescence quantum yield and uniform dispersibility are required for the dopant material. For example, there is disclosed a technique of using a styrylamine derivative, a perylene derivative and a pyrene derivative as a blue emissive material. There is also disclosed a technique of using a combination of a stilbene-based compound, a quinoline derivative and a quinacridon derivative as a green emissive material. There is also disclosed a technique of using a combination of an aminostyryl derivative, a cumarin derivative and a dicyanomethylenepyran derivative as a red emissive material. There is also disclosed a technique of using a pyrromethene-based metal complex as a dopant material (refer to Patent Document 1) and a technique of using a naphthacene derivative in combination with a fluoranthene derivative (refer to Patent Document 2). However, all of the resultant devices had insufficient chromatic purity and durability.

[Non-Patent Document 1]
"Applied Physics Letters", (USA), 1987, Vol. 51, No. 12, pp. 913-915

[Patent Document 1]
Japanese Patent No. 3,389,888

[Patent Document 2]
Japanese Unexamined Patent Publication (Kokai) No. 2003-338377

DISCLOSURE OF THE INVENTION

Thus, ah object of the present invention is to solve these problems in the prior art by providing a light emitting device material having high luminance efficiency and excellent durability.

The present invention provides a light emitting device comprising at least an emissive layer existing between an anode and a cathode, which emits light by means of electric energy, wherein the emissive layer contains at least a compound having a pyrromethene skeletal structure represented by the general formula (1) or a metal complex thereof, and a naphthacene derivative represented by the general formula (2):

[Chemical Formula 1]

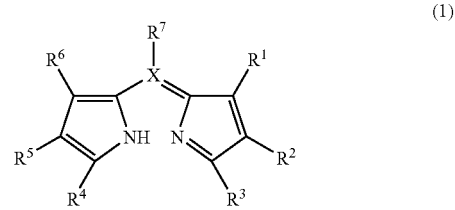

(1)

wherein $R^1$ to $R^7$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, carboxyl group, an oxycarbonyl group, a carbamoyl group, an amino group, a silyl group, a phosphine oxide group, and a ring structure formed between adjacent substituents; X represents a carbon atom or a nitrogen atom, and $R^7$ is absent when X is a nitrogen atom; and metal of a metal complex is at least one selected from among boron, beryllium, magnesium, chromium, iron, cobalt, nickel, copper, zinc and platinum:

[Chemical Formula 2]

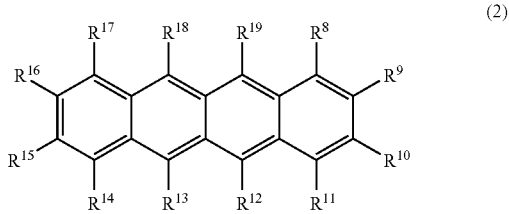

(2)

wherein $R^8$ to $R^{19}$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents.

EFFECT OF THE INVENTION

According to the present invention, a light emitting device having high luminance efficiency and excellent durability can be obtained.

BEST MODE FOR CARRYING OUT THE INVENTION

The light emitting device of the present invention is composed of at least an anode, a cathode, and an organic layer existing between the anode and the cathode.

The material of the anode is not particularly limited as long as it is a material capable of efficiently injecting holes into the organic layer. It is preferred to use a material having comparatively large work function. Examples of the material of the anode include conductive metal oxides such as tin oxide, indium oxide, zinc indium oxide and indium tin oxide (ITO); metals such as gold, silver and chromium; inorganic conductive substances such as copper iodide and copper sulfide; and conductive polymers such as polythiophene, polypyrrole and polyaniline. These electrode materials may be used alone, or plural materials may be laminated or mixed.

The anode preferably has low resistance in view of power consumption of the light emitting device. For example, when ITO is used, it can function as an anode if the resistance is 300Ω/□ or less. Since it becomes possible to supply a substrate having about 10Ω/□, it is particularly preferred to use a product having a low resistance such as 100Ω/□ or less. The thickness of the anode can be optionally selected according to the resistance value, and is usually from 100 to 300 nm.

In order to maintain a mechanical strength of the light emitting device, the anode is preferably formed on a substrate. As the substrate, for example, a glass substrate made of soda glass or non-alkali glass is preferably used. The thickness of the glass substrate may be the thickness enough to maintain the mechanical strength and is therefore 0.5 mm or more. Although non-alkali glass is preferred that small number of ions are eluted from the glass, soda-lime glass with a $SiO_2$ barrier coat is commercially available and can be used. Furthermore, if the anode stably functions, it is not necessary for the substrate to be made of glass and, for example, the anode may be formed on a plastic substrate. The method of forming an anode, for example, an electron beam method, a sputtering method and a chemical reaction method can be preferably used.

The material used for a cathode is not particularly limited as long as it is a substance capable of efficiently injecting electrons into the organic layer, and examples thereof include platinum, gold, silver, copper, iron, tin, zinc, aluminum, indium, chromium, lithium, sodium, potassium, cesium, calcium and magnesium, or an alloy thereof. In order to improve element characteristics by increasing electron injection efficiency, for example, lithium, sodium, potassium, cesium, calcium, magnesium or an alloy containing these low work function metals is effective. However, since these low work function metals are often unstable in atmospheric air, a method of doping the organic layer with a trace amount of (1 nm or less in terms of a thickness tester for vacuum deposition) lithium or magnesium to obtain an electrode having high stability is preferably used. An inorganic salt such as lithium fluoride can also be used. In order to protect the electrode, it is preferred to laminate a material selected from among metals such as platinum, gold, silver, copper, iron, tin, aluminum and indium, alloys using these metals, inorganic substances such as silica, titania and silicon nitride, and polyvinyl alcohol, polyvinyl chloride and a hydrocarbon-based polymer compound. As the method of forming a cathode is not particularly limited, for example, resistance heating, electron beam, sputtering, ion plating and coating can be preferably used.

The organic layer existing between the anode and the cathode is composed of at least an emissive layer. The organic layer may be composed only of an emissive layer, or has a layer structure of 1) hole transporting layer/emissive layer/electron transporting layer, 2) emissive layer/electron transporting layer, or 3) hole transporting layer/emissive layer. Each layer may be composed of a single layer or plural layers. When a hole transporting layer and an electron transporting layer are composed of plural layers, layers contacted with an electrode may be referred to as a hole injection layer and an electron injection layer, respectively. In the following description, the hole injection material is included in the hole transporting material, while the electron injection material is included in the electron transporting material.

The hole transporting layer contains one or more kinds of hole transporting materials. When the hole transporting layer contains two or more kinds of hole transporting materials, the hole transporting materials may be laminated or mixed. The hole transporting material and a polymer binder may be mixed. The hole transporting material is not particularly limited as long as it is a compound which is capable of forming a thin film required for the production of a light emitting device, injecting holes from the anode and transporting holes. Examples of preferred hole transporting materials include, but are not limited to, triphenylamine derivatives such as 4,4'-bis(N-(3-methylphenyl)-N-phenylamino)biphenyl, 4,4'-bis(N-(1-naphthyl)-N-phenylamino)biphenyl and 4,4',4"-tris(3-methylphenyl(phenyl)amino)triphenylamine; biscarbazole derivatives such as bis(N-allylcarbazole) and bis(N-alkylcarbazole); heterocyclic compounds such as pyrazoline derivatives, stilbene-based compounds, hydrazone-based compounds, benzofuran derivatives, thiophene derivatives, oxadiazole derivatives, phthalocyanine derivatives and porphyrin derivatives; and polymers such as polycarbonate having the above monomer in the side chain, styrene, polythiophene, polyaniline, polyfluorene, polyvinylcarbazole and polysilane.

The emissive layer may be composed of a single layer or plural layers. The emissive material of each layer may be a material alone or a mixture of plural materials, and is preferably a mixture of a host material and a dopant material, which can separate functions of film formation, hole and electron transportation and light emission, in view of efficiency, chromatic purity and lifetime. In each emissive layer, only one of a host material and a dopant material may emit light, or both the host material and the dopant material may emit light. Each of the host material and the dopant material may be used alone or in combination. The dopant material may be entirely or partially in the emissive layer. When the amount of the dopant material is too large, concentration quenching occurs. Therefore, the amount of the dopant material is preferably 20% by weight or less, and more preferably 10% by weight or less, based on the total of the host material and the dopant material. Regarding the doping method of the dopant material, the dopant material may be formed by a co-evaporation method with the host material, or evaporation may be performed after preliminarily mixing the host material and the dopant material. Alternatively, the host material and the dopant material may be dissolved in a solvent and the resulting solution may be applied.

The emissive layer of the present invention contains a compound having a pyrromethene skeletal structure represented by the general formula (1) or a metal complex thereof, and a naphthacene derivative represented by the general formula (2). The naphthacene derivative can also be used as the dopant material, and is preferably used as the host material since the naphthacene derivative has high electron transporting characteristics. The compound having a pyrromethene skeletal structure or metal complex thereof can also be used as the host material, and is preferably used as the dopant material since it has high fluorescence quantum yield and has a narrow half-decay lifetime of fluorescent spectrum and thus light having high chromatic purity can be emitted.

The compound having a pyrromethene skeletal structure or metal complex thereof has high fluorescence quantum yield and therefore has high potential as the dopant material. However, an influence of an interaction with the host material is likely to be exerted because of strong electron trapping properties, and thus high luminance efficiency cannot be always realized by entire combinations with host materials. In the present invention, it has been found that the naphthacene derivative is suited for use as the host material as a result of the evaluation of combinations with various host materials. The naphthacene derivative has excellent affinity with the compound having a pyrromethene skeletal structure or metal complex thereof and the movement of energy from the host material to the dopant material efficiently occurs. Since a device with high luminance efficiency can be obtained and the host material does not emit light itself, light having high chromatic purity can be emitted. Furthermore, the emissive region in the emissive layer is noticeably widened by electron trapping properties of the dopant material, and thus lifetime of the device remarkably increases.

The dopant material is not limited only to the compound having a pyrromethene skeletal structure or metal complex thereof alone, and a mixture of plural pyrromethene compounds may be used, or a mixture of one or more kinds of known dopant materials and a pyrromethene compound may be used. Examples of the dopant material include, but are not limited to, compounds having a fused aryl ring, such as anthracene, pyrene and perylene, or derivatives thereof; compounds having a heteroaryl ring, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthylidine, quinoxaline, pyrrolopyridine and thioxanthene, and derivatives thereof; distyrylbenzene derivatives; aminostyryl derivatives; tetraphenylbutadiene derivatives; aldazine derivatives; cumarin derivatives such; azole derivatives such as imidazole, thiazole, thiadiazole, carbazole, oxazole, oxadiazole and triazole, and metal complexes thereof; and aromatic amine derivatives such as 4,4'-bis(N-(3-methylphenyl)-N-phenylamino)biphenyl.

The host material to be contained in the emissive material is not limited only to the naphthacene derivative alone, and a mixture of plural naphthacene derivatives may be used, or a mixture of one or more kinds of known host materials and a naphthacene derivative may be used. Specific examples of preferred host material include aromatic amine derivatives such as 4,4'-bis(N-(1-naphthyl)-N-phenylamino)biphenyl; metal chelated oxynoid compounds such as tris(8-quinolinate)aluminum(III); bisstyryl derivatives such as distyrylbenzene derivatives; tetraphenylbutadiene derivatives; indene derivatives; cumarin derivatives; oxadiazole derivatives; pyrrolopyridine derivatives; perynone derivatives; cyclopentadiene derivatives; oxadiazole derivatives; carbazole derivatives; pyrrlopyrrole derivatives; and polymers such as polyphenylenevinylene derivatives, polyparaphenylene derivatives, polyfluorene derivatives, polyvinylcarbazole derivatives and polythiophene derivatives.

The compound having a pyrromethene skeletal structure represented by the general formula (1) or metal complex thereof will be described below:

[Chemical Formula 3]

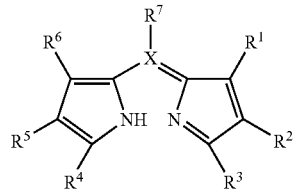

(1)

wherein $R^1$ to $R^7$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents; and X represents a carbon atom or a nitrogen atom, and $R^7$ is absent when X is a nitrogen atom.

Among these substituents, the alkyl group means a saturated aliphatic hydrocarbon group such as a methyl group, an ethyl group, a propyl group or a butyl group with or without substituents. There is no limitation on additional substituents when substituted, and examples thereof include an alkyl group, an aryl group and a heteroaryl group. These comments shall apply in the following description. There is no limitation on the carbon number of the alkyl group. In view of availability and cost, the alkyl group preferably has 1 to 20 carbon atoms.

The cycloalkyl group means a saturated alicyclic hydrocarbon group such as a cyclopropyl group, a cyclohexyl group, a norbornyl group or an adamantyl group with or without substituents. There is no limitation on the carbon number of the cycloalkyl group. The cycloalkyl group preferably has 3 to 20 carbon atoms.

The heterocyclic group means a group composed of an aliphatic ring having an atom other than a carbon atom in the ring, such as a pyran ring, a piperidine ring or a cyclic amide with or without substituents. There is no limitation on the carbon number of the heterocyclic group. The heterocyclic group preferably has 2 to 20 carbon atoms.

The alkenyl group means an unsaturated aliphatic hydrocarbon group containing a double bond, such as a vinyl group, an allyl group or a butadienyl group with or without substituents. There is no limitation on the carbon number of the alkenyl group. The alkenyl group preferably has 2 to 20 carbon atoms.

The cycloalkenyl group means an unsaturated alicyclic hydrocarbon group containing a double bond, such as a cyclopentenyl group, a cyclopentadienyl group or a cyclohexenyl group with or without substituents. There is no limitation on the carbon number of the cycloalkenyl group. The cycloalkenyl group preferably has 3 to 20 carbon atoms.

The alkynyl group means an unsaturated aliphatic hydrocarbon group containing a triple bond, such as an ethynyl group with or without substituents. There is no limitation on the carbon number of the alkynyl group. The alkynyl group preferably has 2 to 20 carbon atoms.

The alkoxy group means an aliphatic hydrocarbon group bonded via an ether bond, such as a methoxy group with or without substituents. There is no limitation on the carbon number of the alkoxy group. The alkoxy group preferably has 1 to 20 carbon atoms.

The alkylthio group is a group in which an oxygen atom of an ether bond of an alkoxy group is substituted with a sulfur atom.

The arylether group means an aromatic hydrocarbon group bonded via an ether bond, such as a phenoxy group with or without substituents. There is no limitation on the carbon number of the arylether group. The arylether group preferably has 6 to 40 carbon atoms.

The arylthioether group is a group in which an oxygen atom of an ether bond of an arylether group is substituted with a sulfur atom.

The aryl group means an aromatic hydrocarbon group bonded via an ether bond, such as a phenyl group, a naphthyl group, a biphenyl group, a phenantolyl group, a terphenyl group or a pyrenyl group with or without substituents. There is no limitation on the carbon number of the aryl group. The arylether group preferably has 6 to 40 carbon atoms.

The heteroaryl group means a cyclic aromatic group having atom(s) other than a carbon atom in the ring, such as a furanyl group, a thiophenyl group, an oxazolyl group, a pyridyl group or a quinolinyl group with or without substituents. There is no limitation on the carbon number of the heteroaryl group. The heteroaryl group preferably has 2 to 30 carbon atoms.

The halogen means an atom selected from among fluorine, chlorine, bromine and iodine.

The carboxyl group, carbamoyl group and amino group are groups in which hydrogen of substituents may have a substituent or not. Examples of substituents include an alkyl group, a cycloalkyl group, an aryl group and a heteroaryl group with or without substituents.

Bonds other than a bond with a pyrromethene skeletal structure in the carbonyl group, oxycarbonyl group and phosphine oxide group are bonded with a substituent selected from among an alkyl group, a cycloalkyl group, an aryl group and a heteroaryl group.

The silyl group means a functional group having a bond to a silicon atom, such as a trimethylsilyl group with or without substituents. There is no limitation on the carbon number of the silyl group. The silyl group preferably has 3 or more and 20 or less carbon atoms. And the silyl group preferably has 1 or more and 6 or less silicon atoms.

When the description is made with reference to the general formula (1), the ring structure to be formed between adjacent groups is as follows: optional adjacent two substituents (for example, $R^1$ and $R^2$) to be selected from among $R^1$ to $R^6$ are combined with each other to form a conjugated or non-conjugated ring structure. These ring structures may contain an atom selected from among nitrogen, oxygen and sulfur atoms in the ring, or may be fused with another ring. These ring structures are preferably composed only of a carbon atom and a hydrogen atom since excellent heat resistance can be obtained.

Since the compound having a pyrromethene skeletal structure or metal complex thereof has excellent affinity with a naphthacene derivative, the movement of energy between the naphthacene derivative as the host material and the compound having a pyrromethene skeletal structure or metal complex thereof as the dopant material efficiently occurs. Therefore, it becomes possible to obtain a light emitting device having both high luminance efficiency and high durability.

In order to more efficiently cause the movement of energy between the naphthacene derivative and the compound having a pyrromethene skeletal structure or metal complex thereof, the compound having a pyrromethene skeletal structure or metal complex thereof is preferably a red emissive material. In order to fulfill the purpose, $R^1$, $R^3$, $R^4$ and $R^6$ in the general formula (1) preferably represent an aryl group or a heteroaryl group. Alternatively, when adjacent substituents of $R^1$ and $R^2$, $R^5$ and $R^6$ are combined with each other to form a conjugated ring structure, it becomes possible to emit red light.

Although the compound having a pyrromethene skeletal structure emits fluorescent light itself and therefore can be used as the dopant material, a metal complex is preferable in view of high chromatic purity and high fluorescence quantum yield. As the metal of the metal complex, metal capable of forming a stable coordinate bond between the metal complex and the pyrromethene skeletal structure is selected. Specific examples of the metal include boron, beryllium, magnesium, chromium, iron, cobalt, nickel, copper, zinc and platinum.

Since high fluorescence quantum yield is obtained, a metal complex represented by the following general formula (3) is preferred in view of light emission with high efficiency.

[Chemical Formula 4]

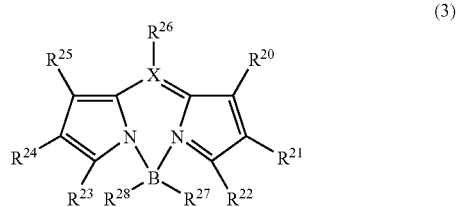

(3)

In the formula, $R^{20}$ to $R^{26}$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents; and $R^{27}$ and $R^{28}$ may be the same or different and are selected from among halogen, hydrogen, an alkyl group, an aryl group and a heterocyclic group. X is a carbon atom or a nitrogen atom and $R^{26}$ is absent when X is a nitrogen atom. The descriptions about these substituents are the same as above.

Specific examples of the pyrromethene metal complex represented by the general formula (3) include, but are not limited to, the followings.

[Chemical Formula 5]
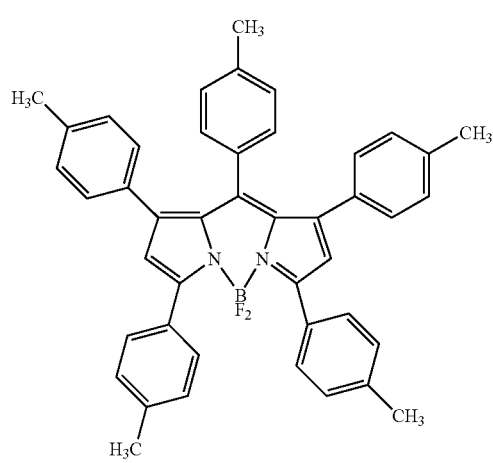
[1]
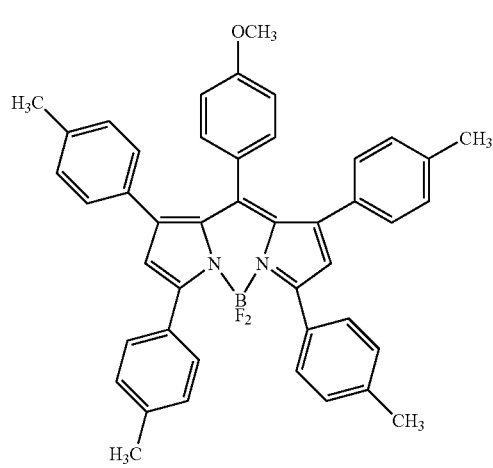
[2]
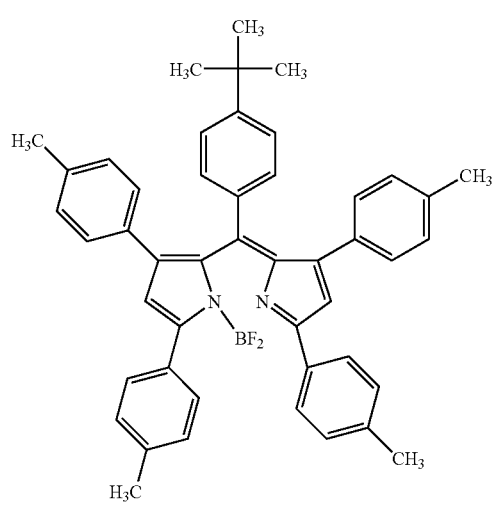
[3]
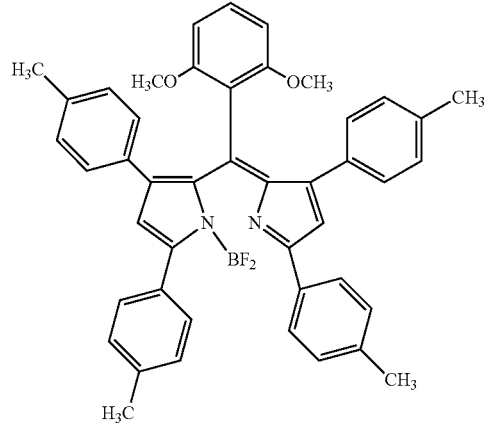
[4]
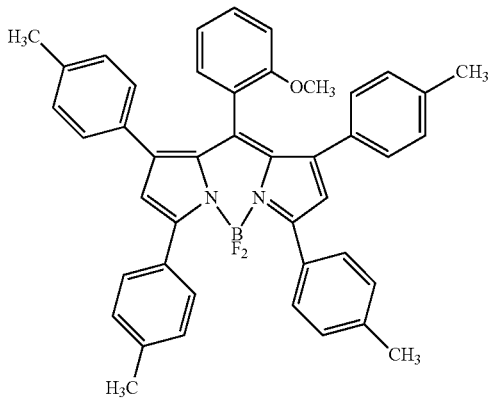
[5]
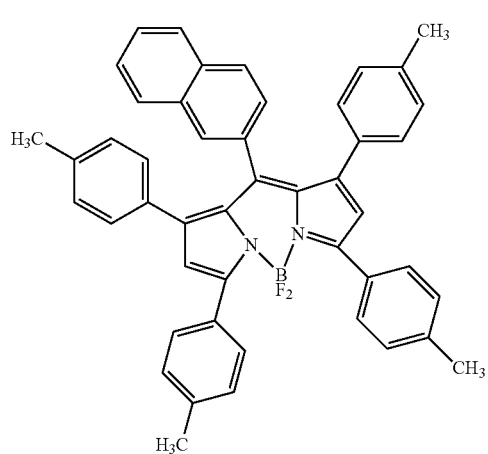
[6]

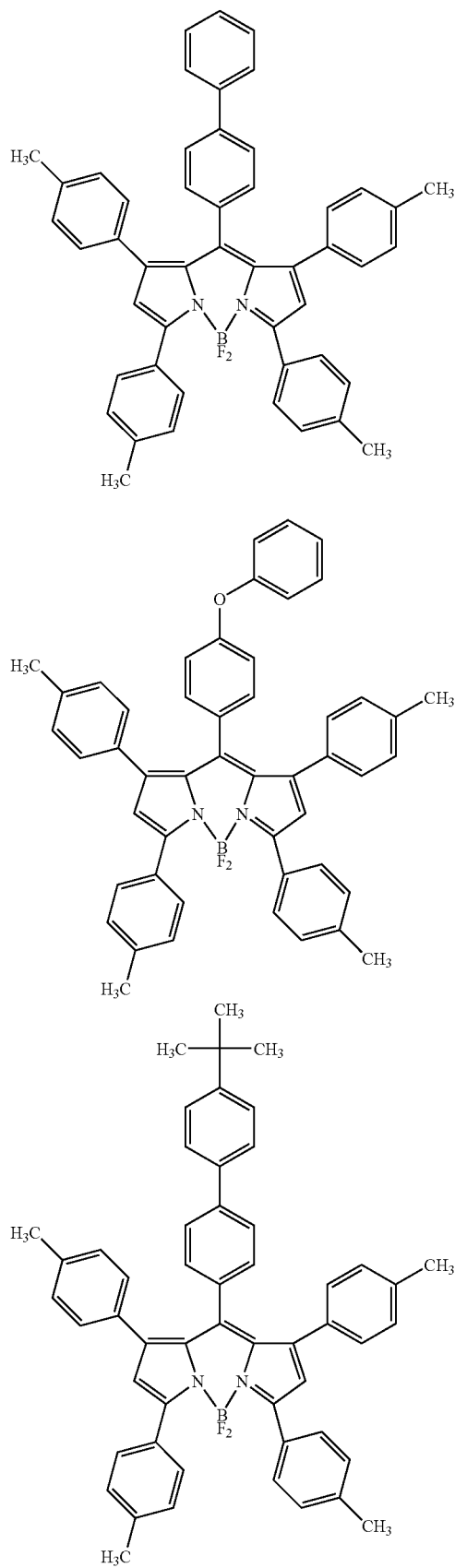
[7]
[8]
[9]
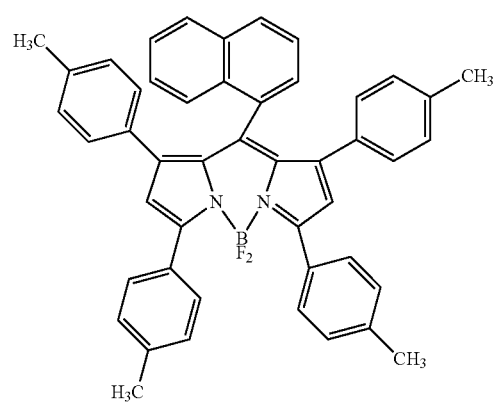
[10]
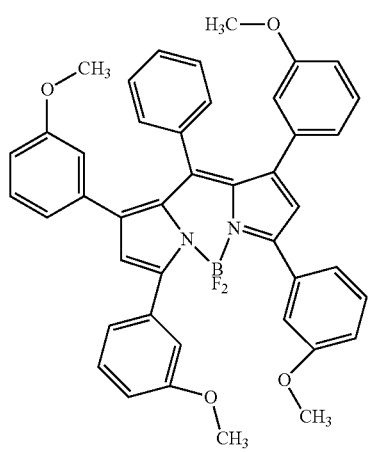
[11]
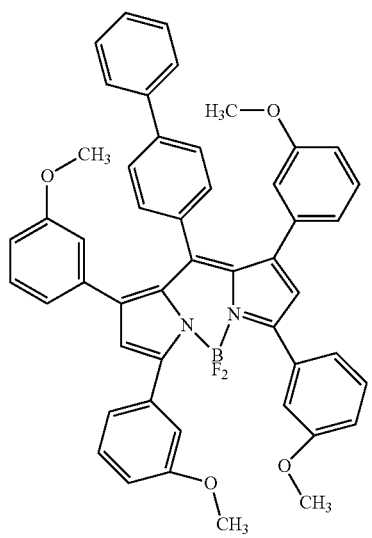
[12]

[Chemical Formula 6]
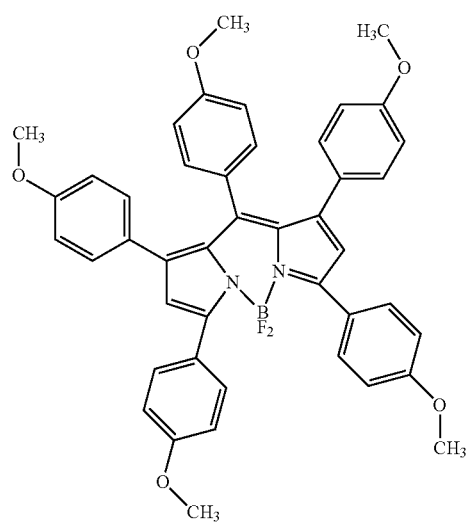
[13]
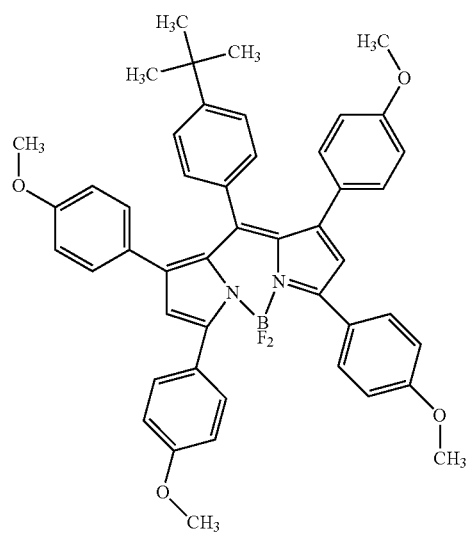
[14]
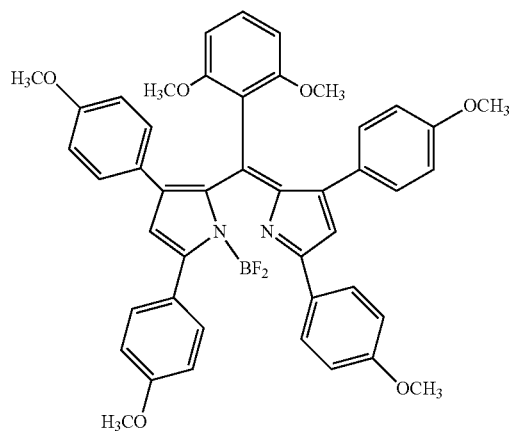
[15]
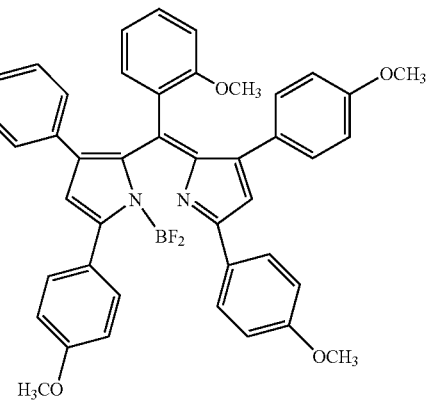
[16]
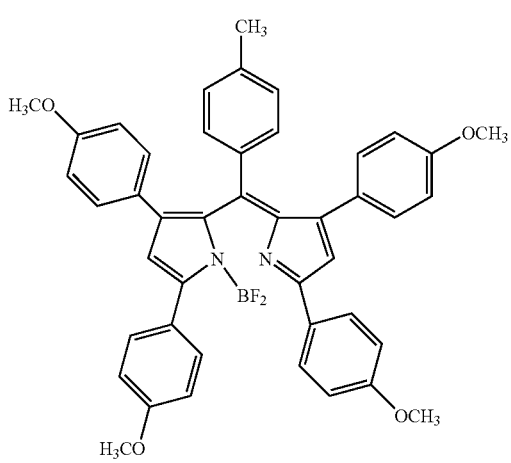
[17]
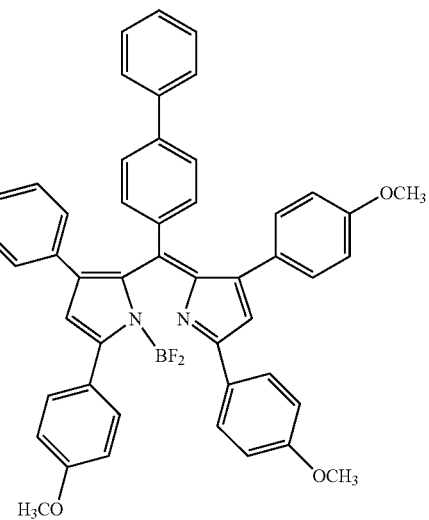
[18]

[19]
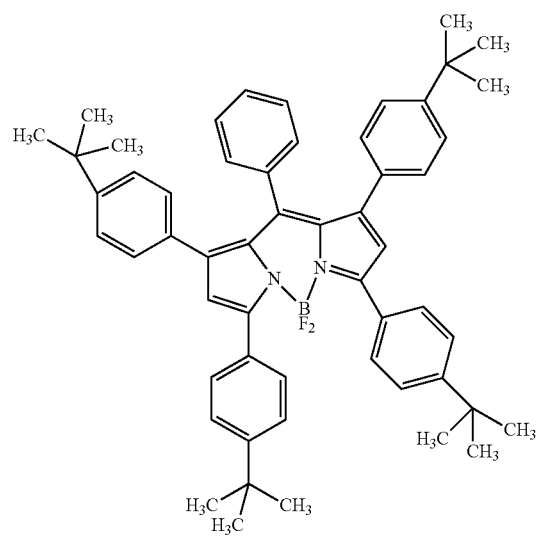
[20]
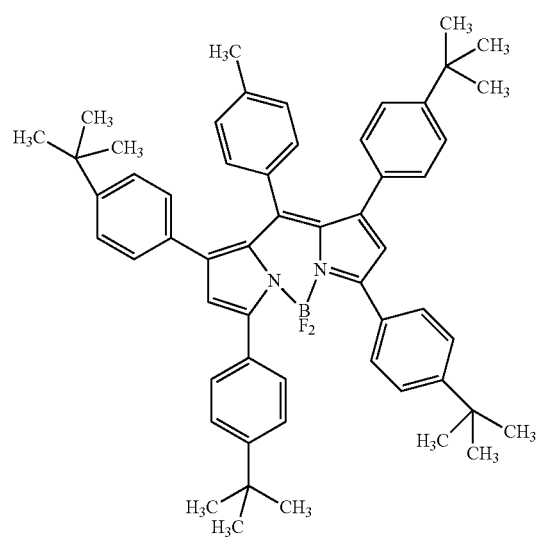
[21]
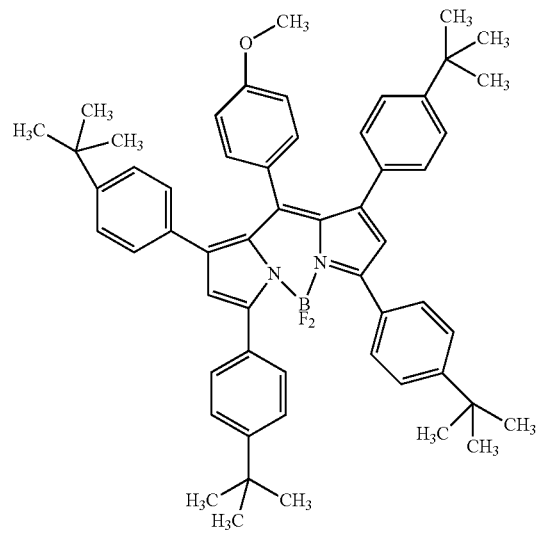
[22]
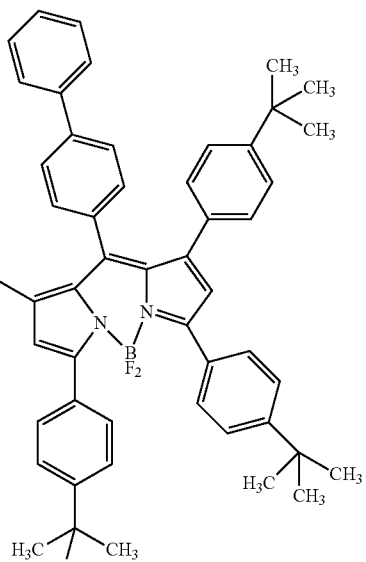
[23]
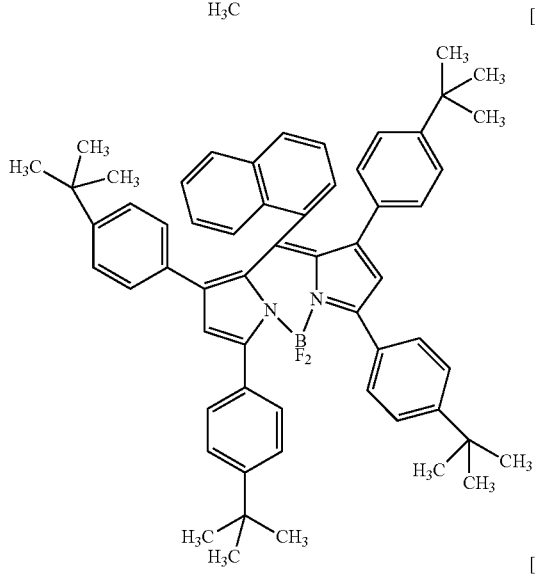
[24]
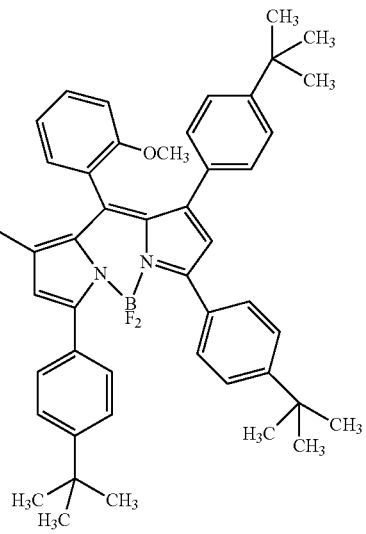

[Chemical Formula 7]
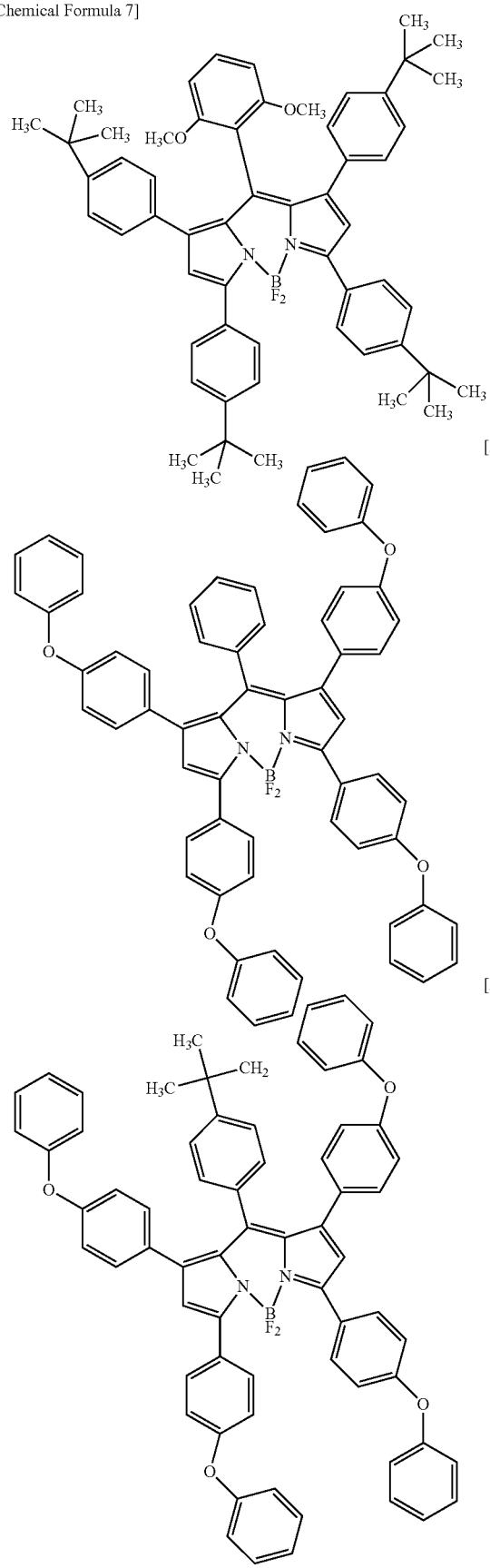
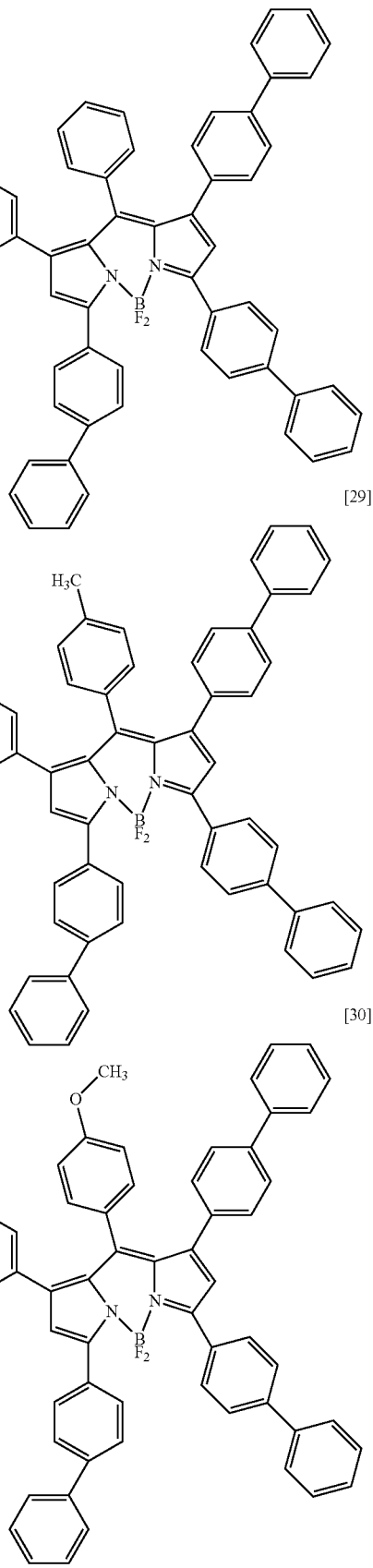

-continued
[31]
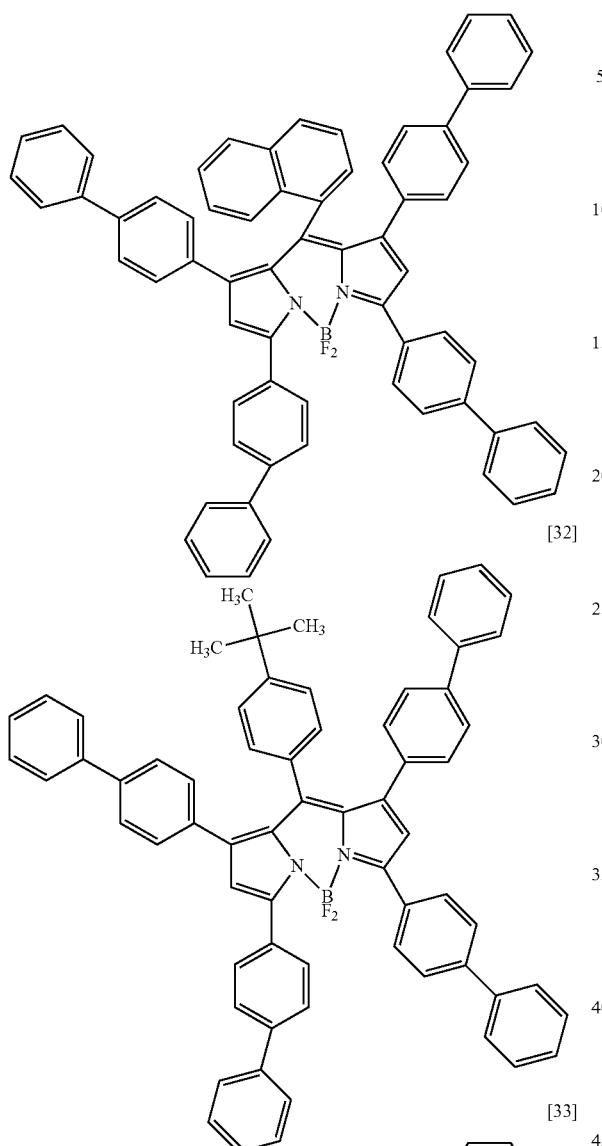
[32]
[33]
-continued
[34]
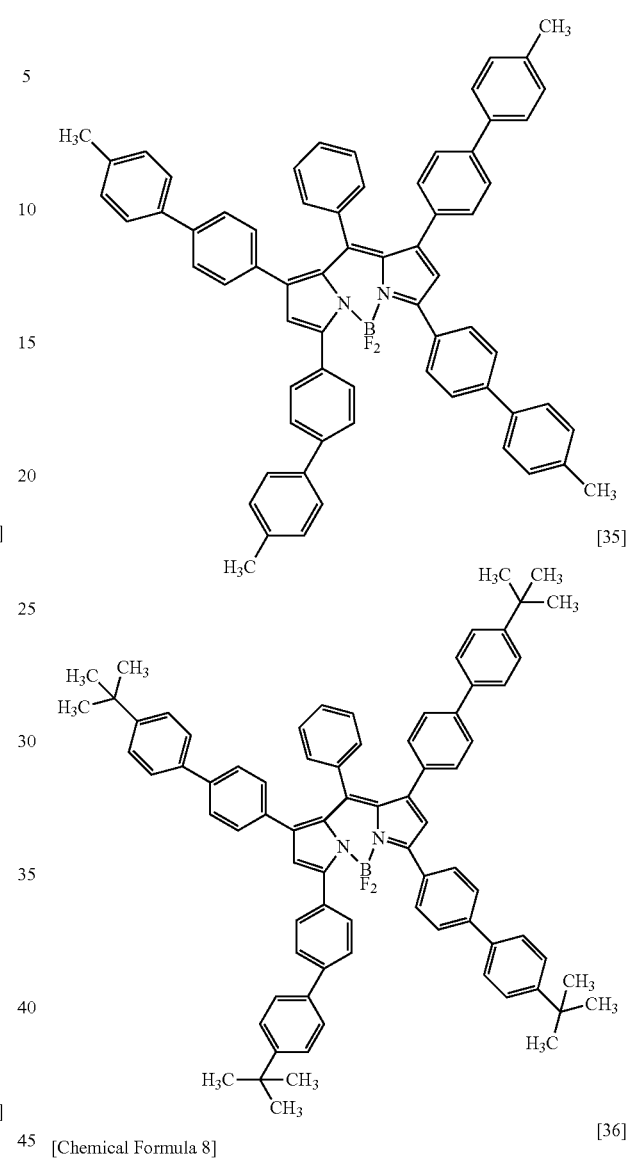
[35]
[Chemical Formula 8]
[36]
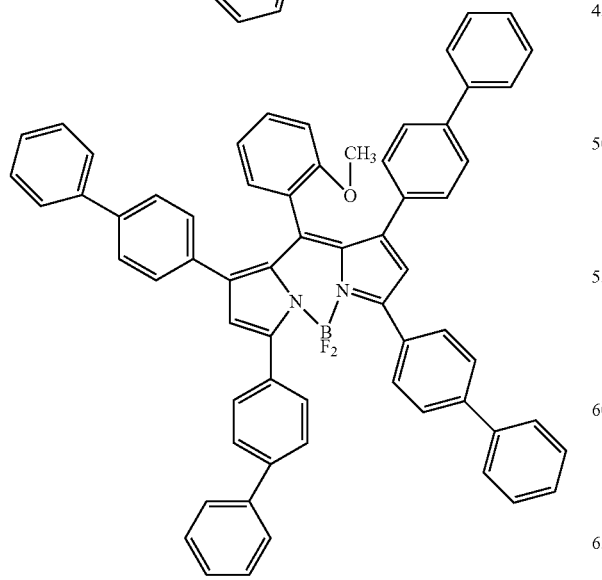
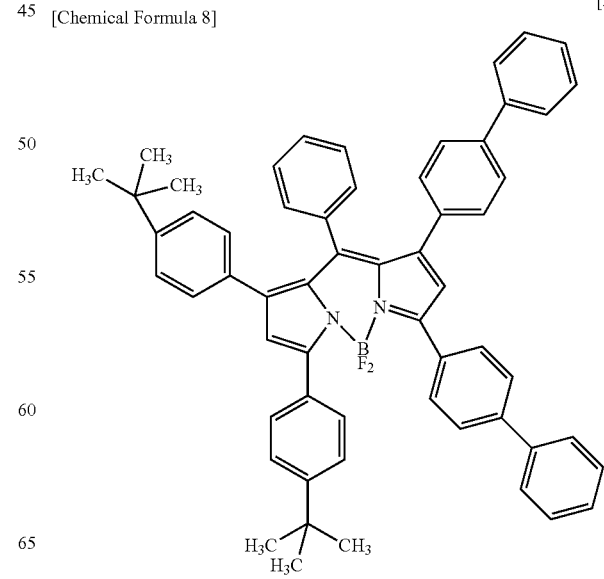

[37]
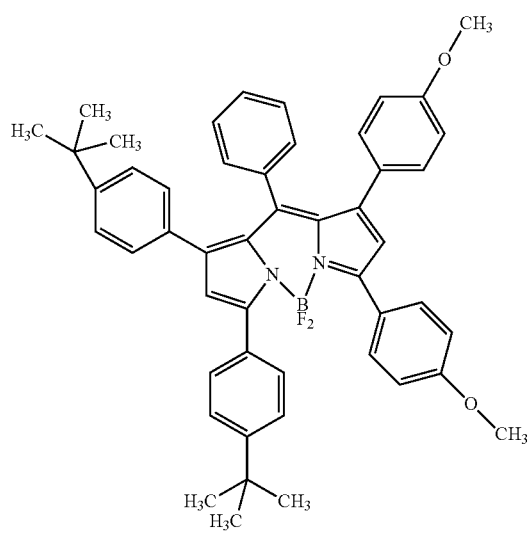
[38]
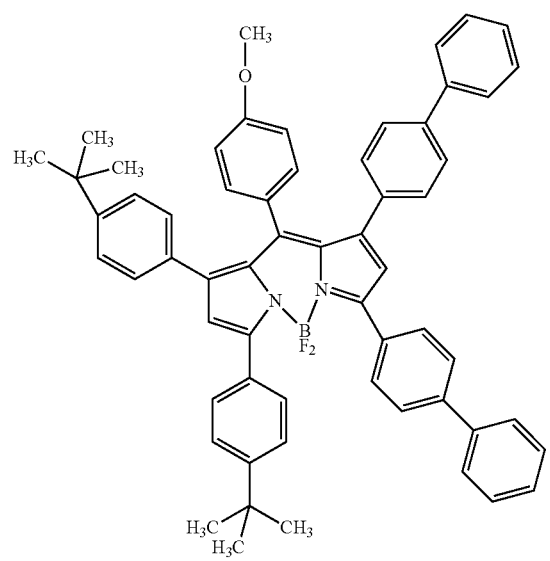
[39]
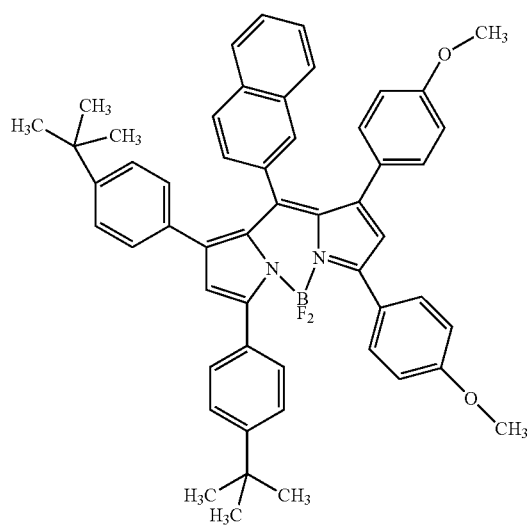
[40]
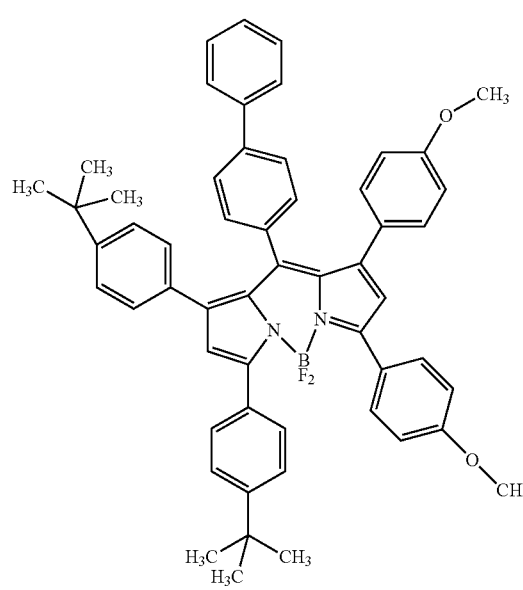
[Chemical Formula 9]
[71]
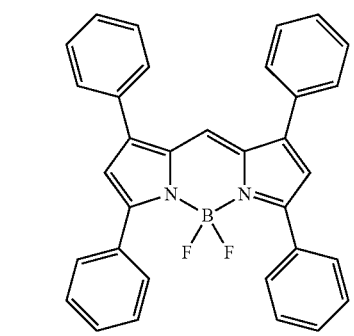
[72]
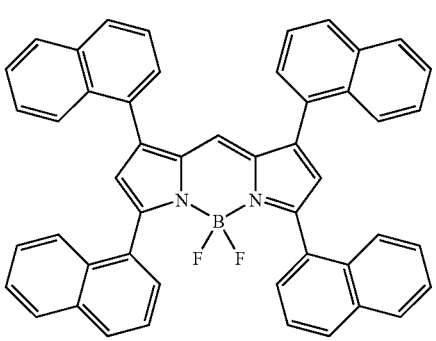
[73]
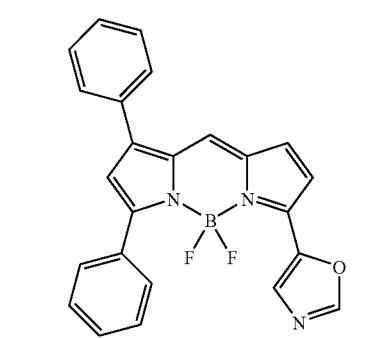

[Chemical Formula 10]
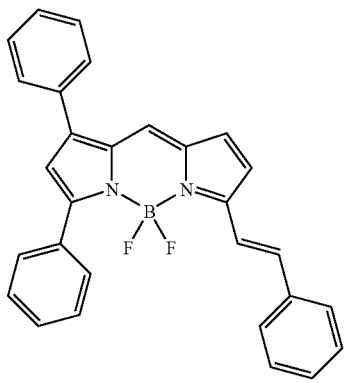 [74]
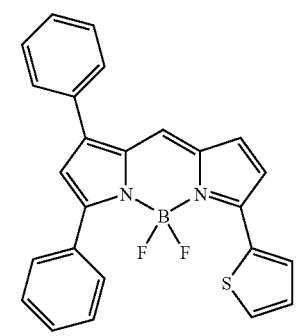 [75]
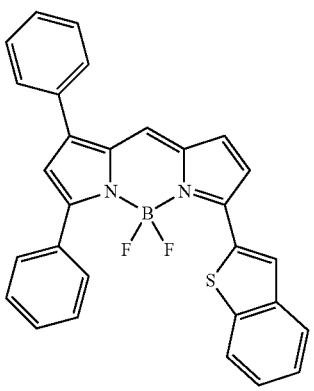 [76]
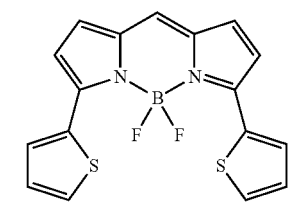 [77]
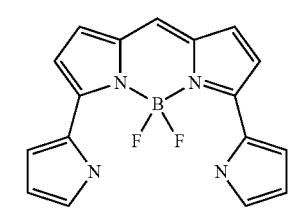 [78]
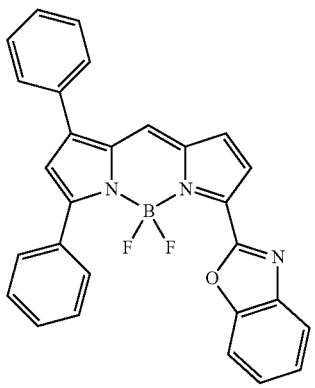 [79]
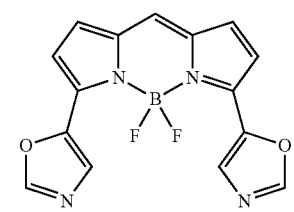 [80]
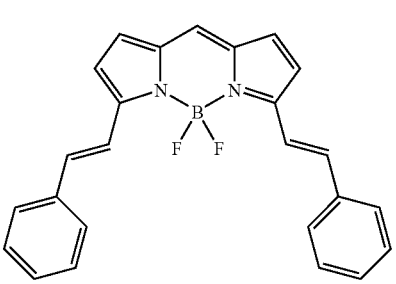 [81]
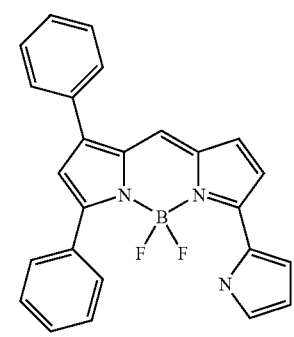 [82]
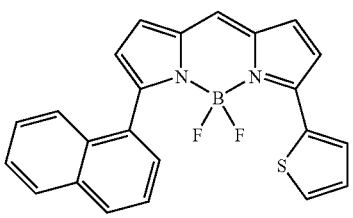 [83]

25
-continued
[84]
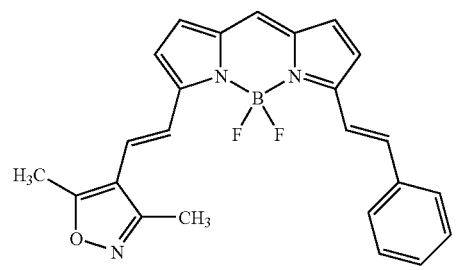
[85]
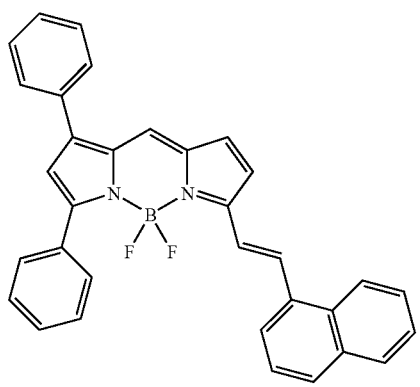
[86]
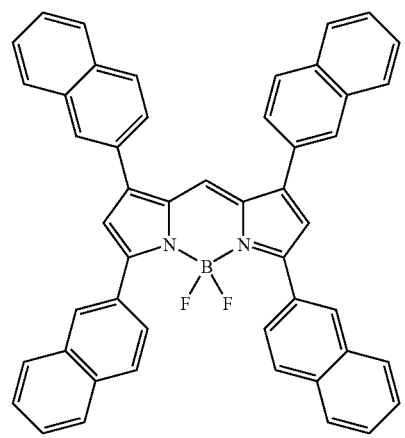
[Chemical Formula 11]
[87]
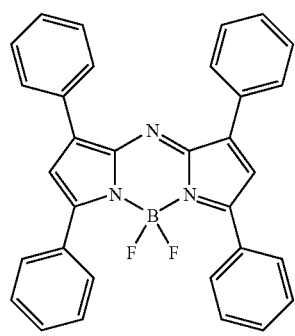
26
-continued
[88]
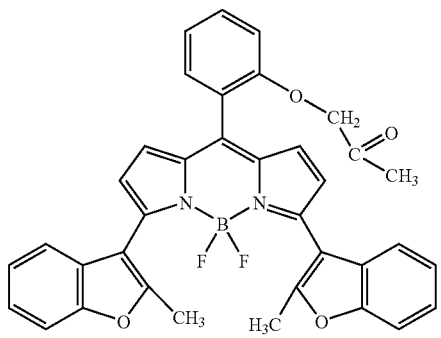
[89]
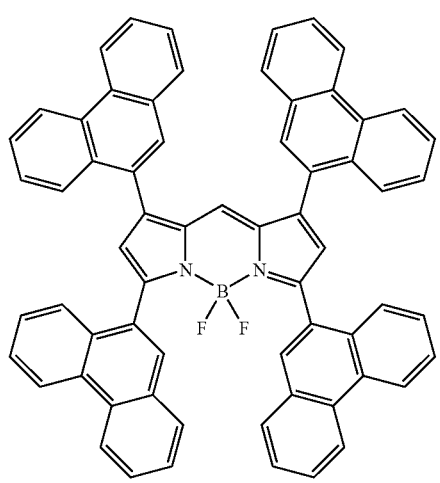
[90]
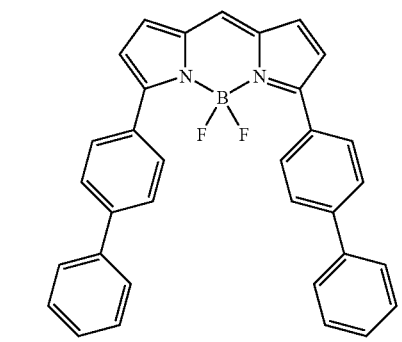

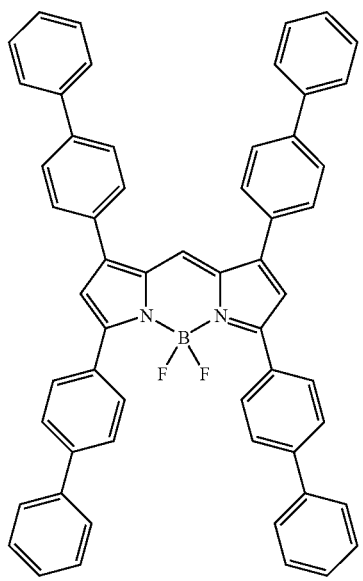
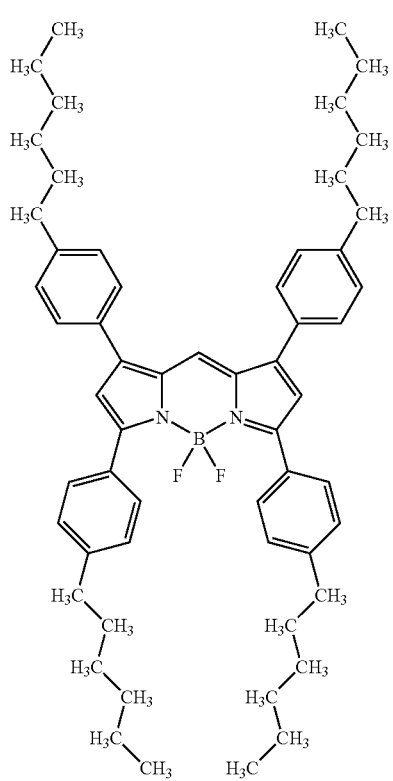
[Chemical Formula 12]
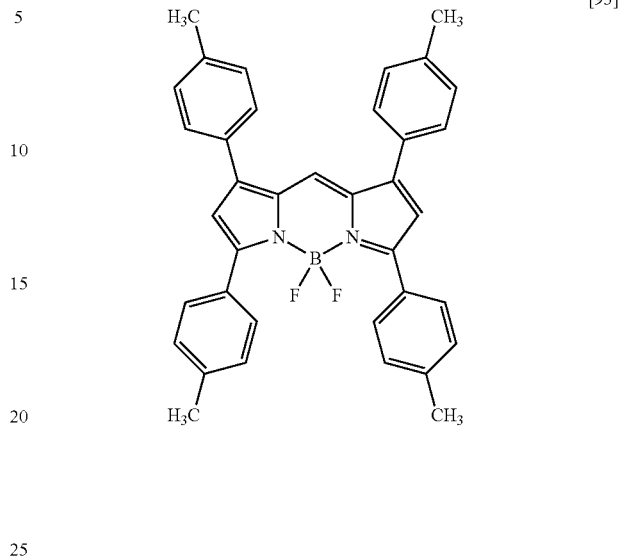
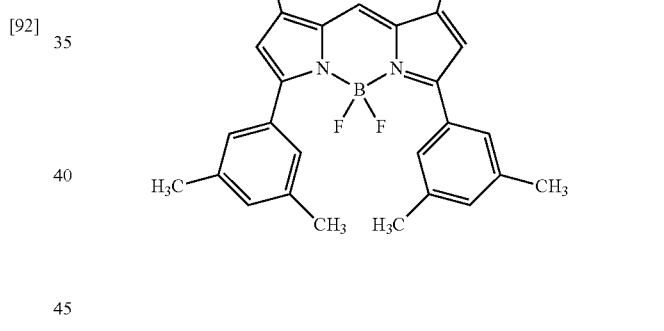
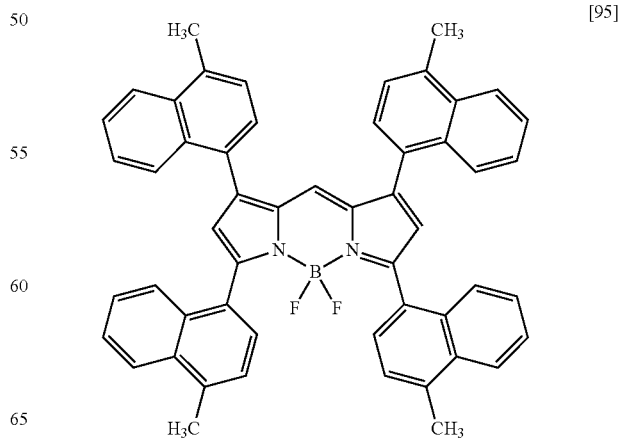

[96]
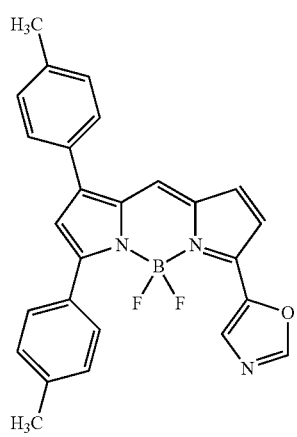
[97]
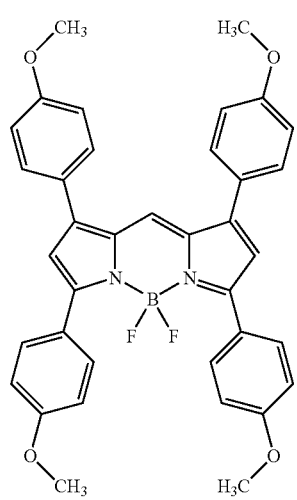
[98]
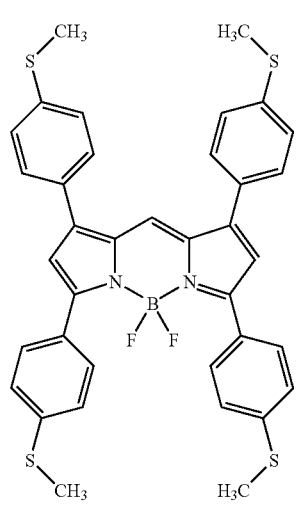
[Chemical Formula 13]
[99]
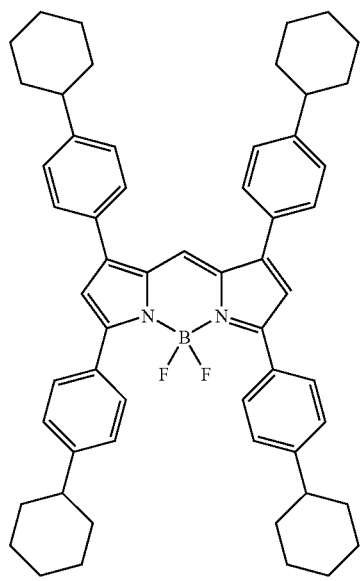
[100]
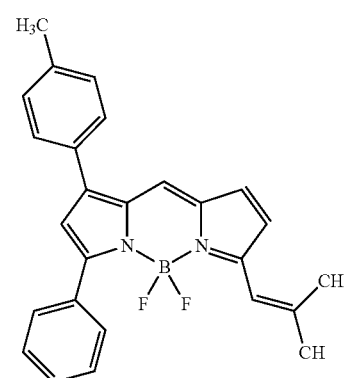
[101]
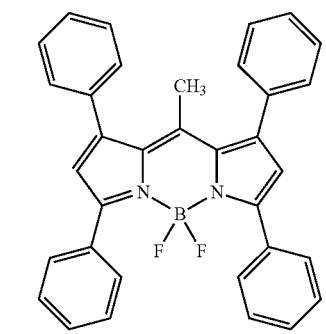

[102]
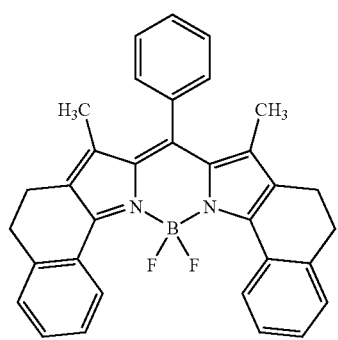
[103]
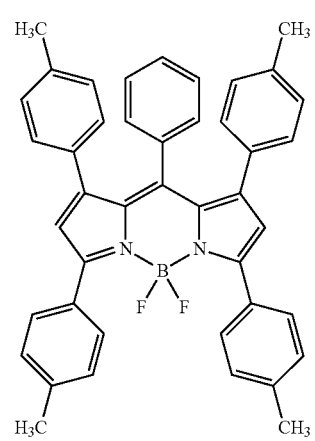
[104]
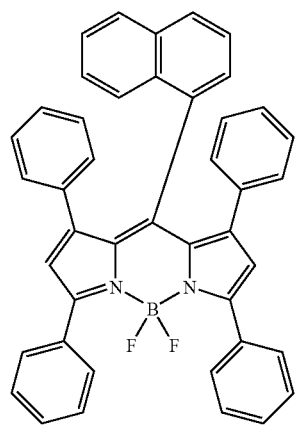
[Chemical Formula 14]
[106]
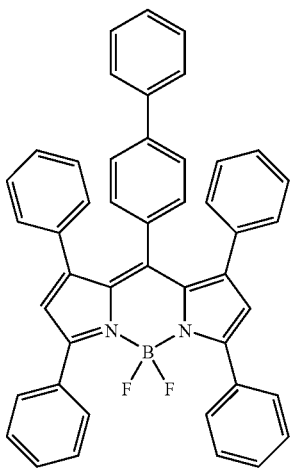
[107]
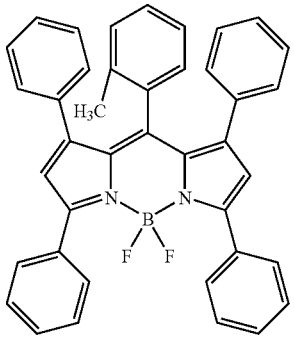
[108]
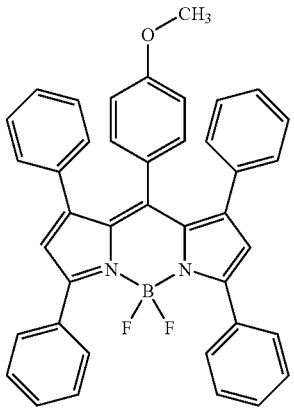
[109]
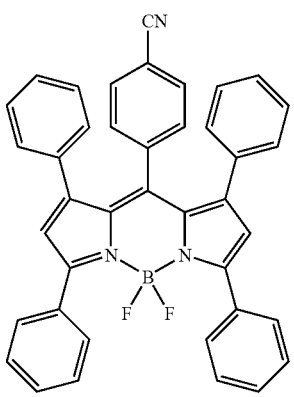

[110]
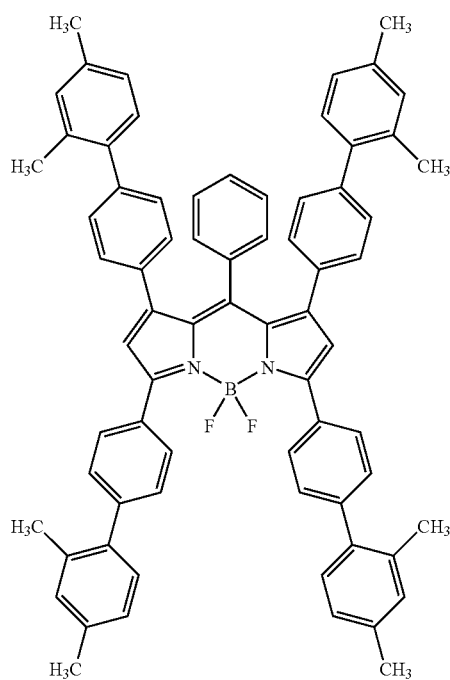
[Chemical Formula 15]
[111]
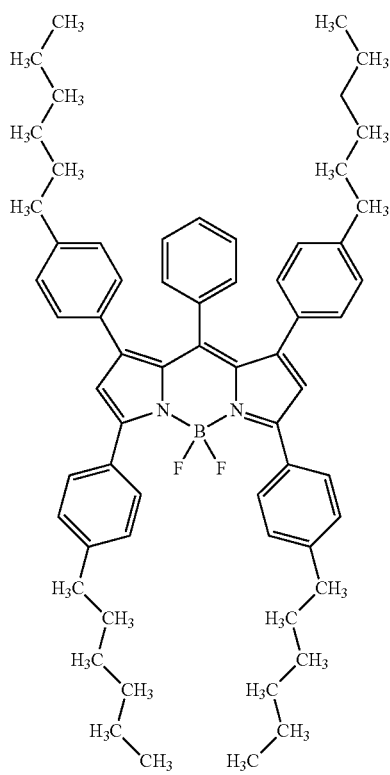
[112]
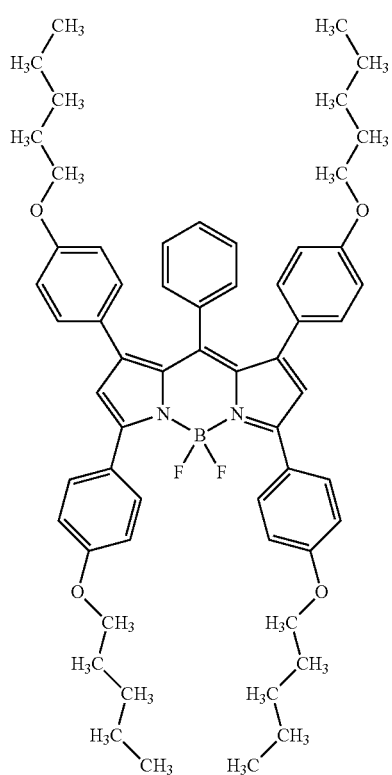
[113]
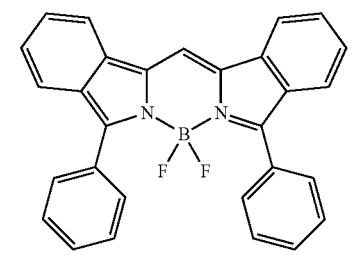
[114]
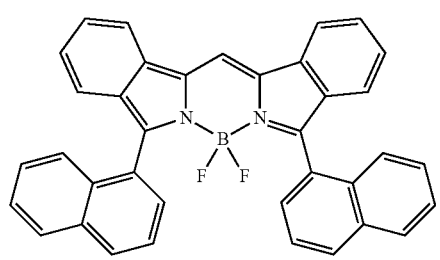
[115]
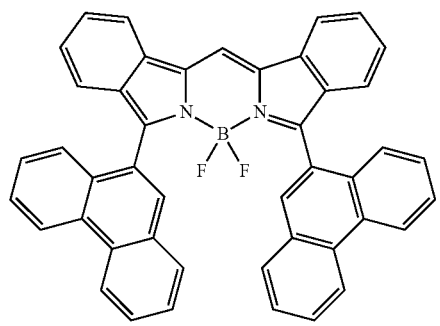

[116]
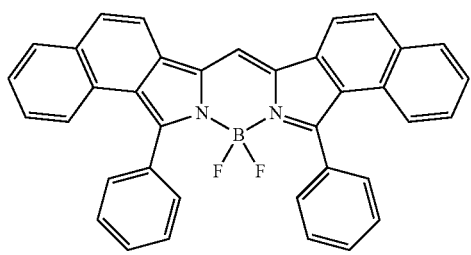
[Chemical Formula 16]
[117]
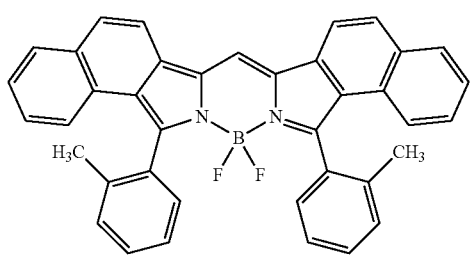
[118]
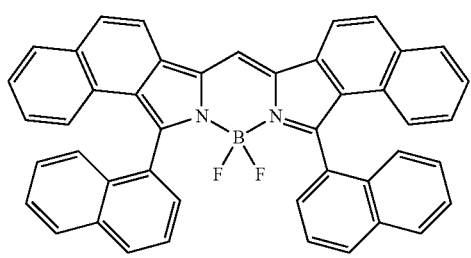
[119]
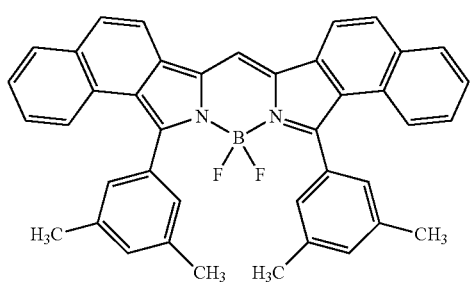
[120]
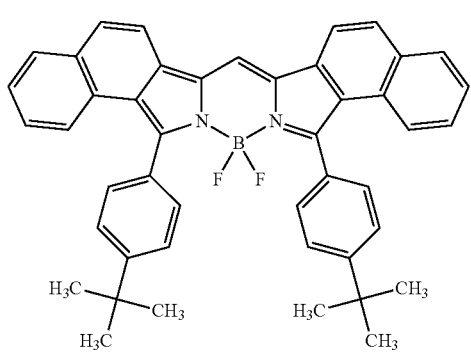
[121]
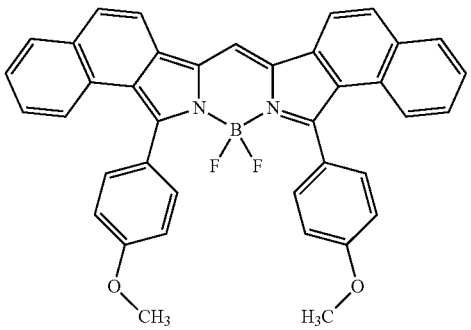
[122]
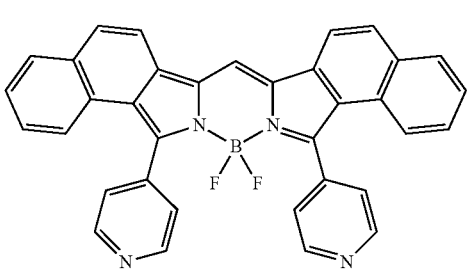
[123]
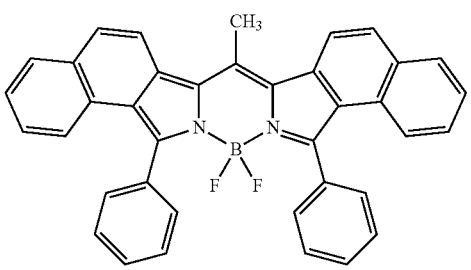
[124]
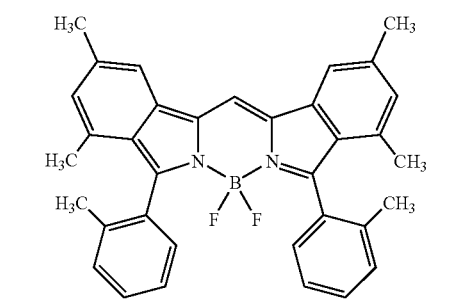
The naphthacene derivative represented by the general formula (2) will be described in detail below.

[Chemical Formula 17]

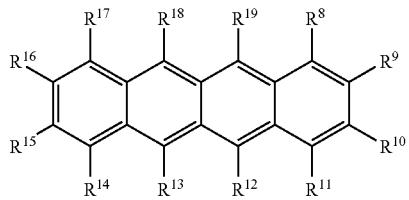

(2)

In the formula, $R^8$ to $R^{19}$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents. The descriptions about these substituents are the same as above.

It is particularly preferred that the naphthacene derivative represented by the general formula (2) in which at least one of $R^8$ to $R^{19}$ is an aryl group, in view of the formation of a stable thin film. Thus, device durability can be improved. In view of electron transporting properties, at least two substituents of $R^8$ to $R^{19}$ are aryl groups. In this case, it is preferred to introduce an aryl group at the combination position of any one of $R^{12}$ and $R^{13}$, $R^{12}$ and $R^{19}$, $R^{12}$ and $R^{18}$, $R^{12}$, $R^{13}$ and $R^{18}$, and $R^{12}$, $R^{13}$, $R^{18}$ and $R^{19}$. In view of ease of synthesis, a naphthacene derivative represented by the following general formula (4) is preferably used.

[Chemical Formula 18]

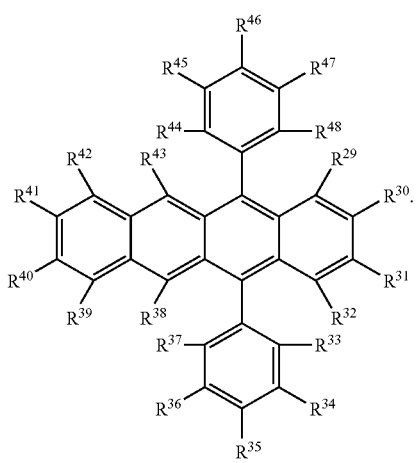

(4)

In the formula, $R^{29}$ to $R^{48}$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents.

Specific examples of the naphthacene derivative having an aryl group include, but are not limited to, the followings.

[Chemical Formula 19]

[59]

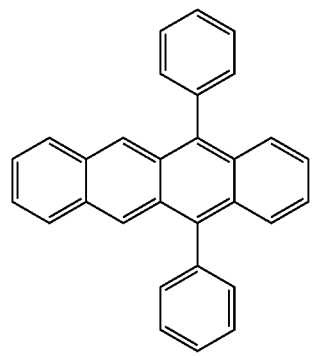

[60]

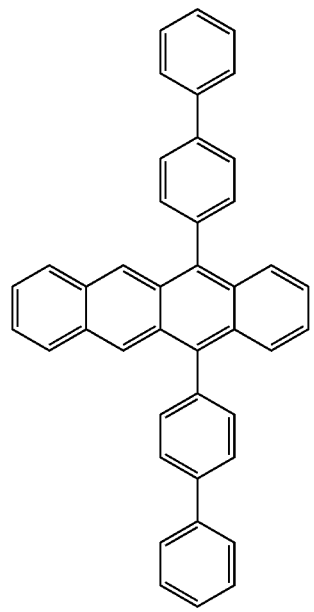

[61]

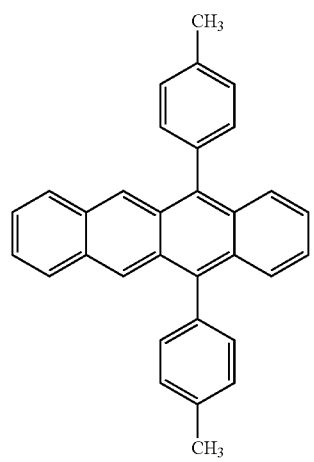

[62] 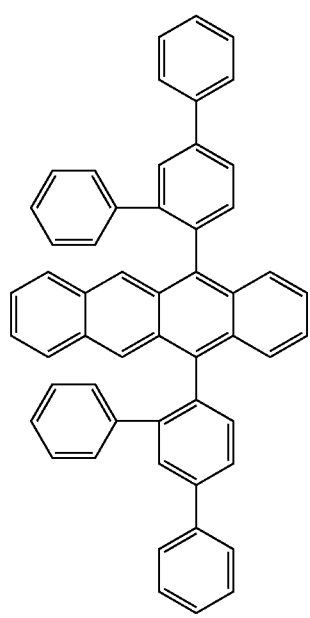
[63] 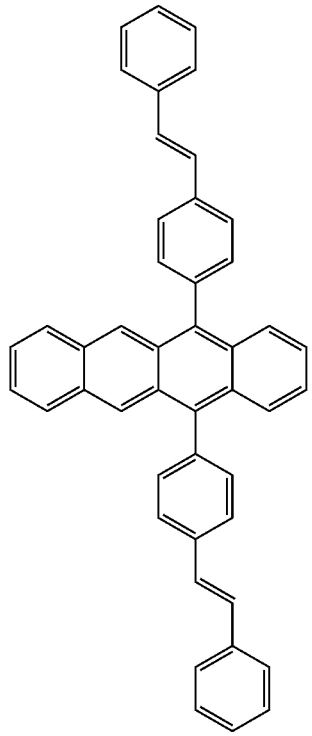
[64] 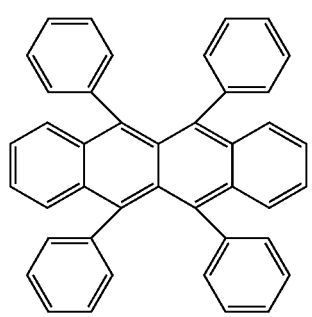
[65] 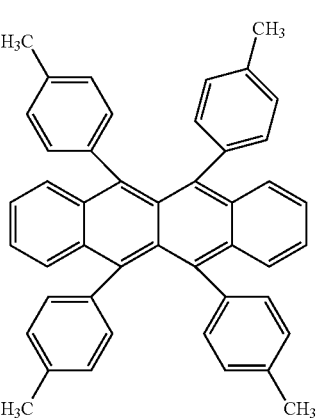
[66]

[Chemical Formula 20]
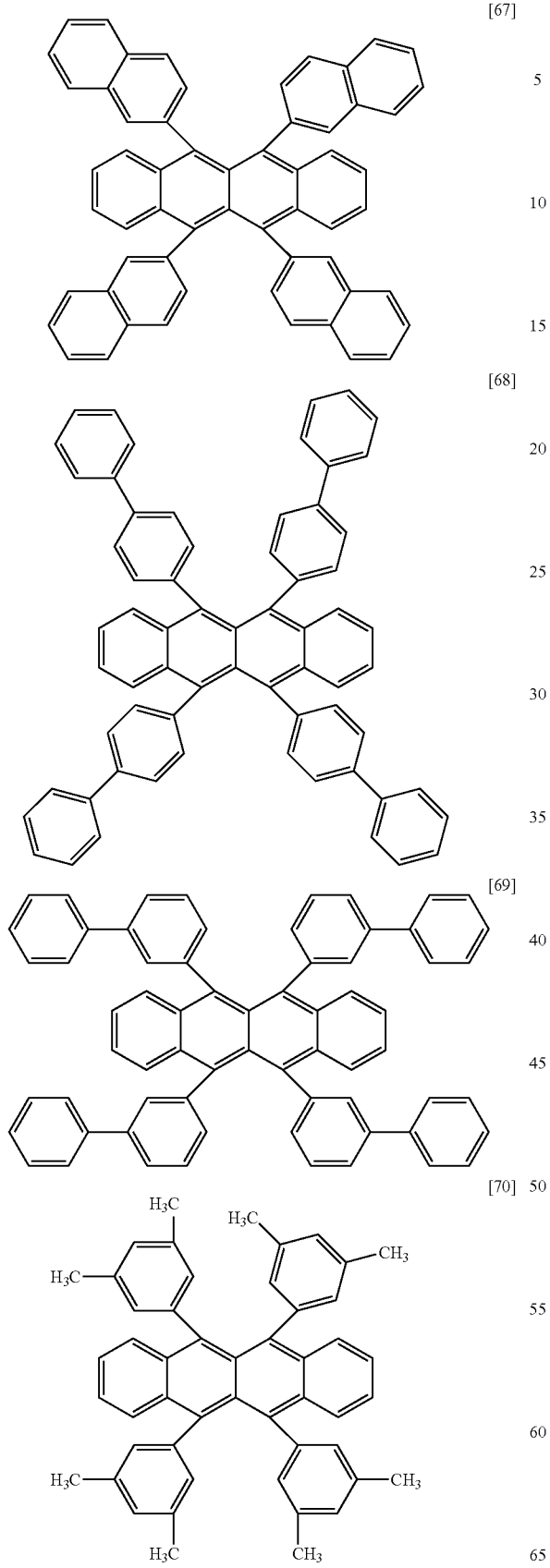
[67]
[68]
[69]
[70]
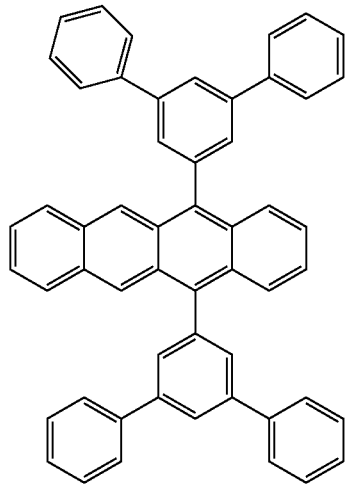
[125]
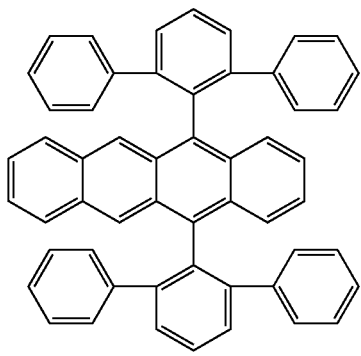
[126]
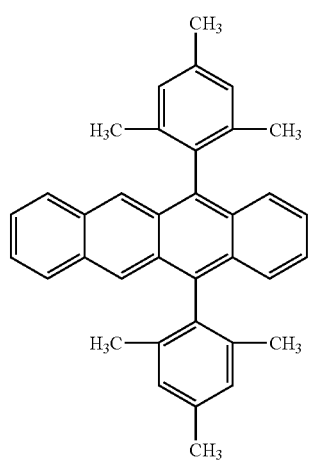
[127]

[128]
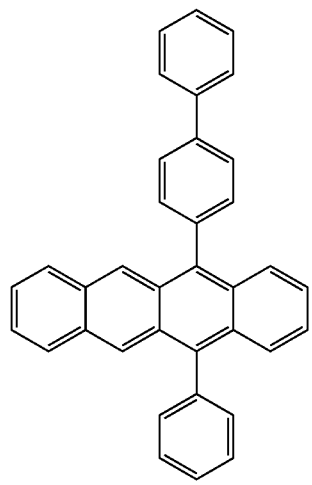
[129]
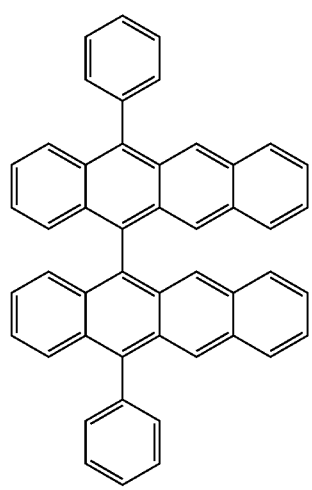
[130]
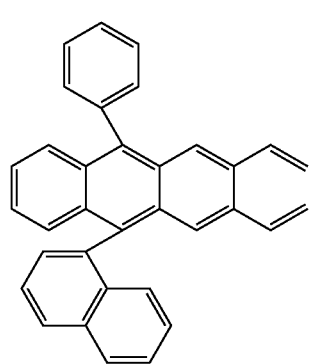
[131]
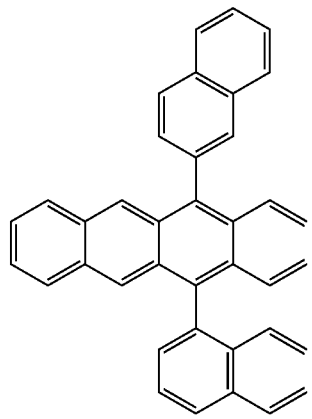
[132]
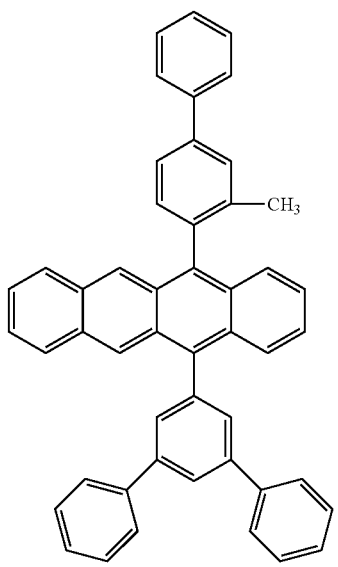
[133]
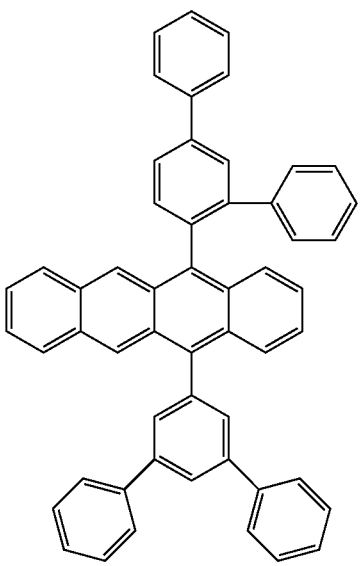

[Chemical Formula 21]
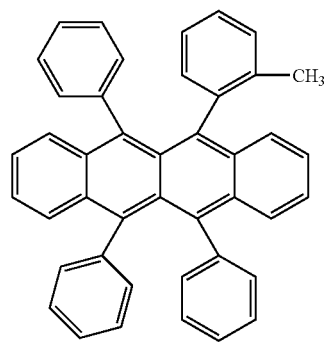
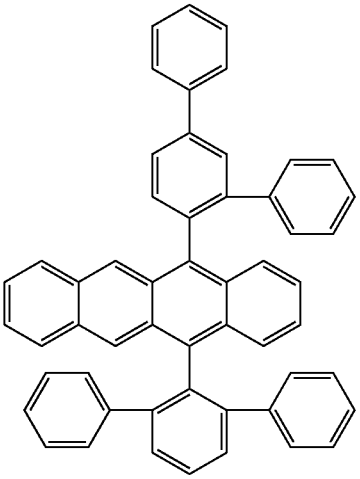
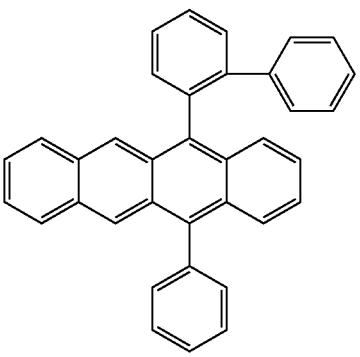
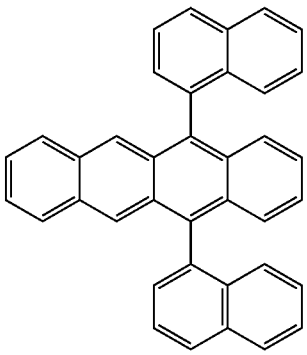
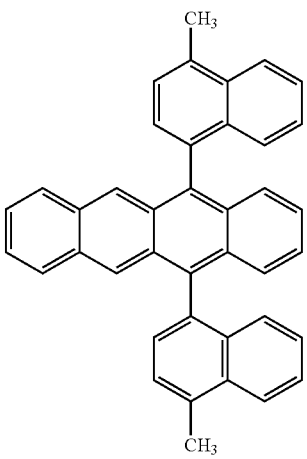

[141]

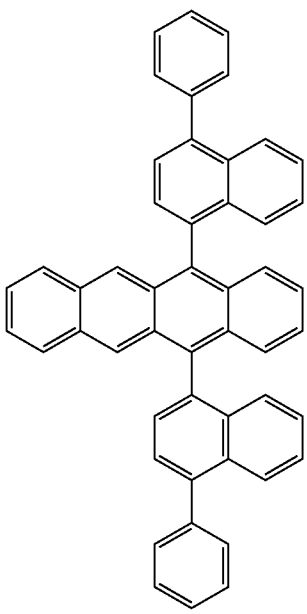

[142]

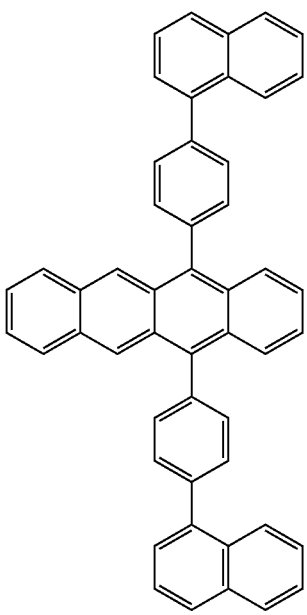

[143]

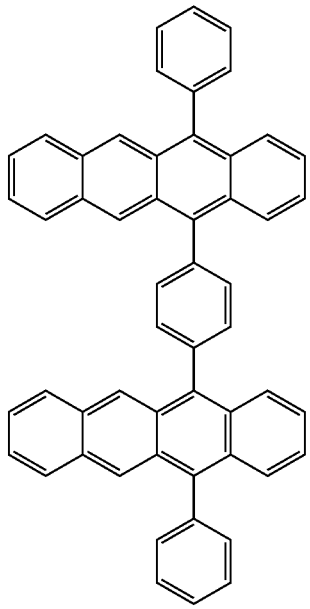

Among the naphthacene derivative of the general formula (4), a naphthacene derivative having a bulky molecular structure and a reduced intermolecular action is more preferably used since it has excellent thin film forming ability and enables light emission with high efficiency and long lifetime. Examples of the naphthacene derivative having a bulky molecular structure include a derivative in which at least one of $R^{33}$ to $R^{37}$ and $R^{44}$ to $R^{48}$ is an aryl group, or a derivative having a conjugated ring structure between the derivative and adjacent substituents. It is more preferred in view of a bulky molecular structure that two or more positions among $R^{33}$ to $R^{37}$ and two or more positions among $R^{44}$ to $R^{48}$ are selected from an aryl group. An example in which at least one of $R^{33}$, $R^{37}$, $R^{44}$ and $R^{48}$ is selected from substituents other than hydrogen or an example in which a ring structure is formed on at least one of $R^{33}$ and $R^{34}$, $R^{36}$ and $R^{37}$, $R^{44}$ and $R^{45}$, and $R^{47}$ and $R^{48}$ is a preferable example since the aryl group introduced into a naphthacene skeletal structure has a twist relationship with respect to the naphthacene skeletal structure, and thus a bulky molecular structure is obtained.

A derivative, in which substituents to be introduced at $R^{33}$ to $R^{37}$ and substituents to be introduced at $R^{44}$ to $R^{48}$ are different and thus an asymmetric molecular structure is formed, is preferred since the same effects as those of the derivative having a bulky molecular structure are exerted.

Among the above derivatives, a derivative including no structural isomer is preferred in view of reproducibility of emissive characteristics. The structural isomer as used herein means that, when two substituents having a twist relationship with respect to the naphthacene skeletal structure are introduced, the substituents introduced can have a cis- and trans-relationship with the plane of the naphthacene skeletal structure. For example, the structural isomer can have the following cis-isomer and trans-isomer structure.

[Chemical Formula 22]

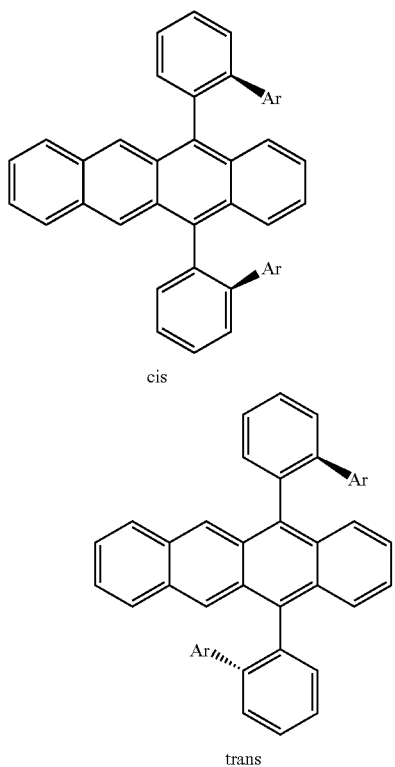

cis trans

When the cis-isomer and the trans-isomer coexist, emissive characteristics of the device can vary depending on a ratio of the cis-isomer and the trans-isomer, resulting in deterioration of reproducibility of emissive characteristics. In order to prevent such a problem, a complicated production process is required in which a naphthacene derivative containing only one structural isomer is produced by sufficient purification. Even after purification, the ratio of the structural isomer can vary depending on isomerization. As described above, the derivative including a structural isomer is not preferred since production cost tends to increase and reproducibility of emissive characteristics can deteriorate.

The naphthacene derivative including no structural isomer includes a naphthacene derivative in which substituents are substituents which are symmetric with respect to a binding axis. Specific examples thereof include compounds [59] to [61], [65] and [125] to [128] among examples described above.

The electron transporting layer will be described below. The electron transporting layer is a layer which transports electrons injected from the cathode. It is required for the electron transporting layer to have high electron injection efficiency and efficiently transport injected electrons. Therefore, the electron transporting layer is preferably composed of a substance which has large electron affinity, large electron mobility and excellent stability and is less likely to generate impurities as a trap during production and use. However, in view of transportation balance between holes and electrons, if the electron transporting layer plays a role of efficiently suppressing flow of holes injected from the anode to the cathode side without being recombined, the effect of improving luminance efficiency is identical to that where the electron transporting layer is composed of a material having high electron transporting ability even if it is composed of a material having not so high electron transporting ability. Therefore, the electron transporting layer in the present invention also includes a hole suppressing layer capable of efficiently suppressing movement of holes as the synonymous layer.

Examples of the electron transporting material to be used for the electron transporting layer include, but are not limited to, fused polycyclic aromatic derivatives such as naphthalene and anthracene, styryl-based aromatic derivatives such as 4,4'-bis(diphenylethenyl)biphenyl; quinone derivatives such as anthraquinone and diphenoquinone; phosphorus oxide derivatives; quinolinol complexes such as tris(8-quinolinolate)aluminum(III); hydroxyazole complexes; azomethine complexes; tropolone metal complexes; and flavonol metal complexes. It is preferred that the electron transporting material is made of a compound which is composed of an element selected from among carbon, hydrogen, nitrogen, oxygen, silicon and phosphorus and has a heteroaryl ring structure containing an electron-accepting nitrogen since a driving voltage can be decreased and light can be emitted with high efficiency. By using in combination with an emissive layer containing a compound having a pyrromethene skeletal structure of the present invention or a metal complex thereof, and a naphthacene derivative, it is easy to maintain balance between holes and electrons in a light emitting device and the balance can be realized while maintaining high charge transporting ability, and thus it becomes possible to reconcile low drive voltage and long lifetime.

The electron-accepting nitrogen means a nitrogen atom which forms a multiple bond between adjacent atoms. Since the nitrogen atom has high electronegativity, the multiple bond has an electron-acceptive property and excellent electron transporting ability, and thus a driving voltage of the light emitting device can be decreased when used for the electron transporting layer. Therefore, a heteroaryl ring containing an electron-accepting nitrogen has high electron affinity and the drive voltage of the light emitting device can be decreased by using for the electron transporting layer. Examples of the heteroaryl ring containing an electron-accepting nitrogen include a pyridine ring, a pyrazine ring, a pyrimidine ring, a quinoline ring, a quinoxaline ring, a naphthylidine ring, a pyrimidopyrimidine ring, a benzoquinoline ring, a phenanthroline ring, an imidazole ring, an oxazole ring, an oxadiazole ring, a triazole ring, a thiazole ring, a thiadiazole ring, a benzooxazole ring, a benzothiazole ring, a benzimidazole ring and a phenanthroimidazole ring.

Examples of preferred compound having a heteroaryl ring structure include benzimidazole derivatives, benzoxazole derivatives, benzthiazole derivatives, oxadiazole derivatives, thiadiazole derivatives, triazole derivatives, pyrazine derivatives, phenanthroline derivatives, quinoxaline derivatives, quinoline derivatives, benzoquinoline derivatives, oligopyridine derivatives such as bipyridine and terpyridine, quinoxaline derivatives and naphthylidine derivatives. Among these compounds, there can be preferably used imidazole derivatives such as tris(N-phenylbenzimidazol-2-yl)benzene; oxadiazole derivatives such as 1,3-bis[(4-tert-butylphenyl)1,3,4-oxadiazolyl]phenylene; triazole derivatives such as N-naphthyl-2,5-diphenyl-1,3,4-triazole; phenanthroline derivatives such as bathocuproine and 1,3-bis(1,10-phenanthrolin-9-yl)benzene; benzoquinoline derivatives such as 2,2'-bis(benzo[h]quinolin-2-yl)-9,9'-spirobifluorene; bipyridine derivatives such as 2,5-bis(6'-(2',2''-bipyridyl))-1,1-dimethyl-3,4-diphenylsilole; terpyridine derivatives such as 1,3-bis(4'-(2,2':6'2''-terpyridinyl))benzene; and naphthylidine derivatives such as bis(1-naphthyl)-4-(1,8-naphthylidin-2-yl)phenylphosphine oxide in view of electron transporting ability.

The electron transporting material may be used alone, or two or more kinds of the electron transporting materials may be used in combination, or one or more kinds of other electron transporting materials may be used in combination with the electron transporting material. It is also possible to use in combination with metals such as alkali metals and alkali earth metals. The ionization potential of the electron transporting layer is not particularly limited, and is preferably 5.8 eV or more and 8.0 eV or less, and more preferably 6.0 eV or more and 7.5 eV or less.

Examples of the method of forming each layer constituting the light emitting device include, but are not limited to, a resistance heating evaporation method, an electron beam evaporation method, a sputtering method, a molecular stacking method, a coating method, an ink-jetting method, a printing method and a laser induced thermal transfer method. In view of element characteristics, a resistance heating evaporation method or an electron beam evaporation method is usually preferred.

The thickness of each layer varies depending on a resistance value of an emissive substance and cannot be limited, but is selected within a range from 1 to 1,000 nm. The thickness of each layer is preferably 1 nm or more and 200 nm or less, and more preferably 5 nm or more and 100 nm or less.

The light emitting device of the present invention has a function capable of converting electric energy into light. Reference to electrical energy primarily means direct current but it is also possible to use a pulse current or alternating current. There is no limitation on values of the current and voltage. Taking into account power consumption and the life of the device, the maximum luminance should be obtained at as low energy as possible.

The light emitting device of the present invention is preferably used as matrix and/or segment displays.

Reference to matrix in the present invention means the matrix array of pixels used for display, and by association of pixels the display of characters or images is effected. The shape and size of the pixels is determined by the application. In the case of image and character display by personal computers, monitors and televisions, there are normally used square-shaped pixels with up to 300 μm sides, and in the case of large-size displays such as display panels there are normally used pixels with sides of the mm order. In the case of a monochrome display, there may be arrayed pixels of the same color but, in the case of a color display, red, green and blue pixels are arranged side by side. In such circumstances, typically there are delta and stripe types. The method of driving the matrix may be either the active matrix or passive matrix driving method. Construction is simpler in the case of passive matrix driving, while an active matrix may be superior in operational characteristics, so here too selection will be made according to the application.

Segment type in the present invention means that a pattern is formed so as to display previously-determined data, and there is emission in a predetermined region. Examples include time and temperature displays by digital watches and thermometers, operating-state displays in the case of audio equipment and microwave ovens, vehicle panel displays and the like. Now, the aforesaid matrix and segment displays may also both be present in the same panel.

The light emitting device of the present invention can also be favorably employed as a back light. A back light is primarily used for the purposes of enhancing the visibility of a display means which is not self-illuminating, and it may be employed for liquid crystal display devices, watches, audio equipments, automobile panels, signboards, signs and the like. In particular, liquid crystal display devices and, especially, conventional personal computers, have comprised fluorescent bulbs or light-guiding sheets, so making these thinner has been difficult. However, thin, lightweight, products are possible with backlights employing the light emitting device of the present invention.

EXAMPLES

The present invention will be described below by way of Examples, but the present invention is not limited to the following Examples. Numbers of compounds in the following Examples mean numbers of compounds described in the above chemical formulas.

Example 1

Using a naphthacene compound [60] and a pyrromethene compound [21], a light emitting device was produced by the following manner. A glass substrate (manufactured by GEO-MATEC Co., Ltd., 11Ω/□, sputtered product) on which an ITO transparent conductive film measuring 150 nm in thickness was formed was cut into pieces measuring 38×46 mm, followed by etching. The resulting substrate was subjected to ultrasonic washing for 15 minute periods using "Semico-Clean® 56" (manufactured by Furuuchi Chemical Corporation), followed by washing with ultra-pure water. Immediately before production of the device, this substrate was subjected to a UV/ozone treatment for one hour and placed in vacuum vapor-deposition equipment, and then the equipment was evacuated until the degree of vacuum inside reached $5 \times 10^{-4}$ Pa or less. A 10 nm thick layer of copper phthalocyanine as a hole injecting layer was formed first, and a 50 nm thick layer of 4,4'-bis(N-(1-naphthyl)-N-phenylamino)biphenyl as a hole transporting layer was formed using a resistance heating method. Using the naphthacene derivative [60] as a host material and the compound [21] as a dopant material, a 40 nm thick layer of an emissive material having a doping concentration of 1% was formed. Then, a 35 nm thick layer of H-1 represented by the formula shown below as an electron transporting material was formed. A 0.5 nm thick layer of lithium fluoride was formed and then a 1,000 nm thick layer of aluminum was formed as a cathode, and thus a device measuring 5×5 mm was produced. The film thickness is the value displayed by means of a quartz crystal oscillator type film thickness monitor. From this light emitting device, red light having high efficiency and high chromatic purity was emitted at luminance efficiency of 2.5 lm/W and chromatility CIE(x, y)=(0.63, 0.36). This light emitting device was subjected to DC driving at 40 mA/cm². As a result, a luminance half-decay lifetime was 1,500 hours.

[Chemical Formula 23]

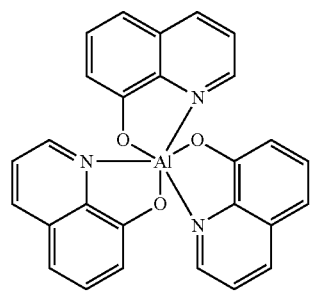

(H-1)

Example 2

In the same manner as in Example 1, except that the naphthacene compound [65] was used as the host material and the pyrromethene compound [37] was used as a dopant material, a light emitting device was produced. From this light emitting device, red light having high efficiency and high chromatic purity was emitted at luminance efficiency of 2.2 lm/W and chromatility CIE(x, y)=(0.65, 0.35). This light emitting device was subjected to DC driving at 40 mA/cm$^2$. As a result, a luminance half-decay lifetime was 1,900 hours.

Comparative Example 1

In the same manner as in Example 1, except that the compound H-1 shown above was used as the host material, a light emitting device was produced. From this light emitting device, orange light was emitted at luminance efficiency of 0.5 lm/W and chromatility CIE(x, y)=(0.60, 0.38). This light emitting device was subjected to DC driving at 40 mA/cm$^2$. As a result, a luminance half-decay lifetime was 600 hours.

Comparative Example 2

In the same manner as in Example 2, except that the compound D-1 shown below was used as the dopant material, a light emitting device was produced. From this light emitting device, orange light was emitted at luminance efficiency of 0.8 lm/W and chromatility CIE(x, y)=(0.58, 0.40) was emitted. This light emitting device was subjected to DC driving at 40 mA/cm$^2$. As a result, a luminance half-decay lifetime was 200 hours.

[Chemical Formula 24]

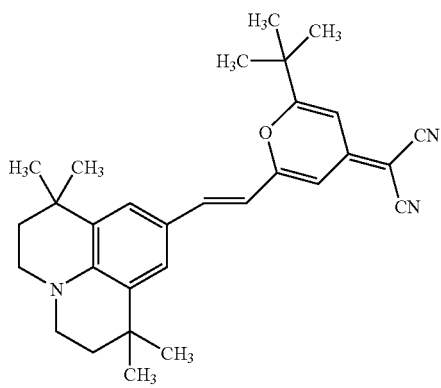

(D-1)

Comparative Example 3

In the same manner as in Example 2, except that the compound D-2 shown below was used as the dopant material, a light emitting device was produced. From this light emitting device, red light was emitted at luminance efficiency of 1.7 lm/W and chromatility CIE(x, y)=(0.67, 0.33) was emitted. This light emitting device was subjected to DC driving at 40 mA/cm$^2$. As a result, a luminance half-decay lifetime was 800 hours.

[Chemical Formula 25]

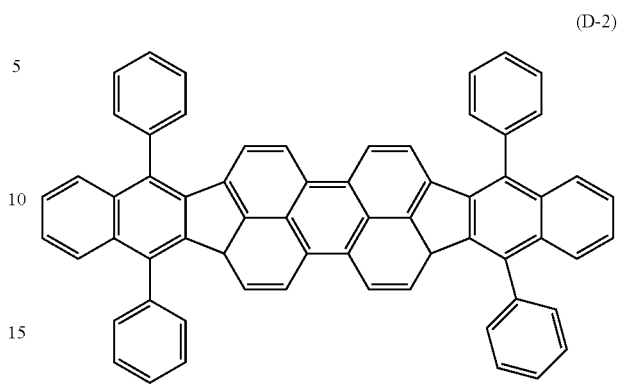

(D-2)

Example 3

In the same manner as in Example 2, except that the phenanthroline derivative E-1 shown below was used as the electron transporting material having a heteroaryl ring structure containing an electron-accepting nitrogen, a light emitting device was produced. From this light emitting device, red light having high efficiency and high chromatic purity was emitted at luminance efficiency of 2.7 lm/W and chromatility CIE(x, y)=(0.68, 0.32) was emitted. This light emitting device was subjected to DC driving at 40 mA/cm$^2$. As a result, a luminance half-decay lifetime was 2,500 hours.

[Chemical Formula 26]

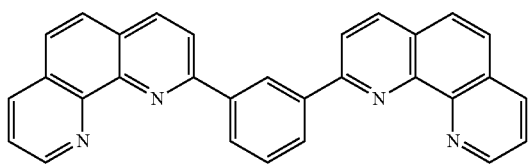

(E-1)

Example 4

In the same manner as in Example 1, except that the naphthacene compound [62] was used as the host material and the pyrromethene compound [24] was used as the dopant material, a light emitting device was produced. From this light emitting device, red light having high efficiency and high chromatic purity was emitted at luminance efficiency of 2.9 lm/W and chromatility CIE(x, y)=(0.64, 0.36) was emitted. This light emitting device was subjected to DC driving at 40 mA/cm$^2$. As a result, a luminance half-decay lifetime was 2,500 hours.

Comparative Example 4

In the same manner as in Example 4, except that the compound D-2 was used as the dopant material, a light emitting device was produced. From this light emitting device, red light having high efficiency and high chromatic purity was emitted at luminance efficiency of 1.7 lm/W and chromatility CIE(x, y)=(0.67, 0.33) was emitted. This light emitting

Example 5

In the same manner as in Example 1, except that the pyrromethene compound [24] was used as the dopant material, a light emitting device was produced. From this light emitting device, red light having high efficiency and high chromatic purity was emitted at luminance efficiency of 2.5 lm/W and chromatility CIE(x, y)=(0.64, 0.36) was emitted. This light emitting device was subjected to DC driving at 40 mA/cm$^2$. As a result, a luminance half-decay lifetime was 2,000 hours.

Comparative Example 5

In the same manner as in Example 4, except that the perynone derivative H-2 shown below was used as the host material, a light emitting device was produced. From this light emitting device, red light was emitted at luminance efficiency of 0.3 lm/W and chromatility CIE(x, y)=(0.64, 0.36) was emitted. This light emitting device was subjected to DC driving at 40 mA/cm$^2$. As a result, a luminance half-decay lifetime was 300 hours.

[Chemical Formula 27]

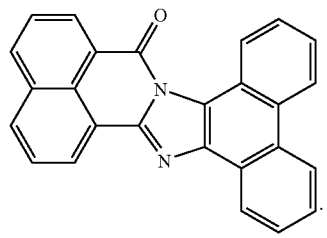

(H-2)

Comparative Example 6

In the same manner as in Example 4, except that the quinoxaline derivative H-3 shown below was used as the host material, a light emitting device was produced. From this light emitting device, red light was emitted at luminance efficiency of 0.2 lm/W and, chromatility CIE(x, y)=(0.64, 0.36) was emitted. This light emitting device was subjected to DC driving at 40 mA/cm$^2$. As a result, a luminance half-decay lifetime was 300 hours.

[Chemical Formula 28]

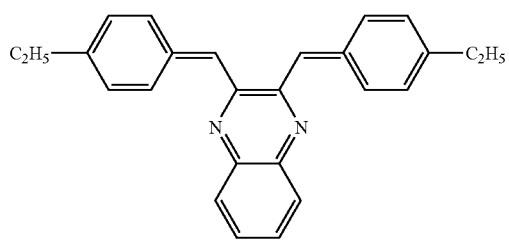

(H-3)

Comparative Example 7

In the same manner as in Example 4, except that the compound D-3 shown below was used as the dopant material, a light emitting device was produced. From this light emitting device, red light was emitted at luminance efficiency of 1.0 lm/W and chromatility CIE(x, y)=(0.60, 0.40) was emitted. This light emitting device was subjected to DC driving at 40 mA/cm$^2$. As a result, a luminance half-decay lifetime was 600 hours.

[Chemical Formula 29]

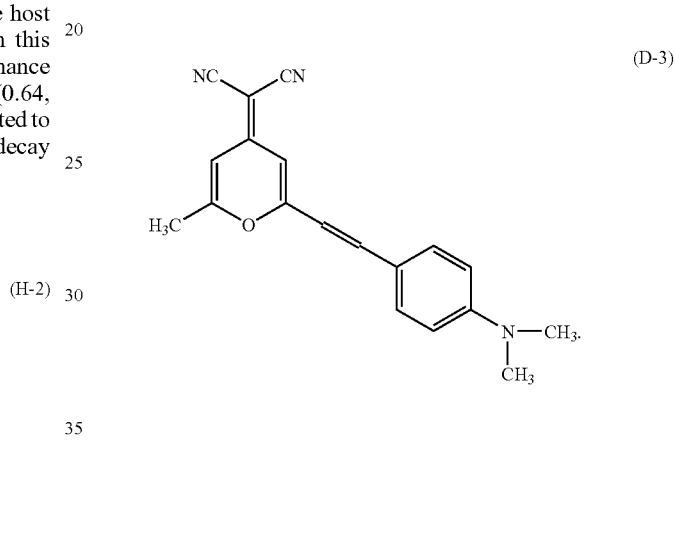

(D-3)

Example 6

In the same manner as in Example 4, except that the naphthacene compound [126] was used as the host material, a light emitting device was produced. From this light emitting device, red light having high efficiency and high chromatic purity was emitted at luminance efficiency of 3.1 lm/W and chromatility CIE(x, y)=(0.64, 0.36) was emitted. This light emitting device was subjected to DC driving at 40 mA/cm$^2$. As a result, a luminance half-decay lifetime was 3,200 hours.

Example 7

In the same manner as in Example 6, except that the pyridine derivative E-2 shown below was used as the electron transporting material having a heteroaryl ring structure containing an electron-accepting nitrogen, a light emitting device was produced. From this light emitting device, red light having high efficiency and high chromatic purity was emitted at luminance efficiency of 3.8 lm/W and chromatility CIE(x, y)=(0.66, 0.34) was emitted. This light emitting device was subjected to DC driving at 40 mA/cm$^2$. As a result, a luminance half-decay lifetime was 3,500 hours.

[Chemical Formula 30]

(E-2)

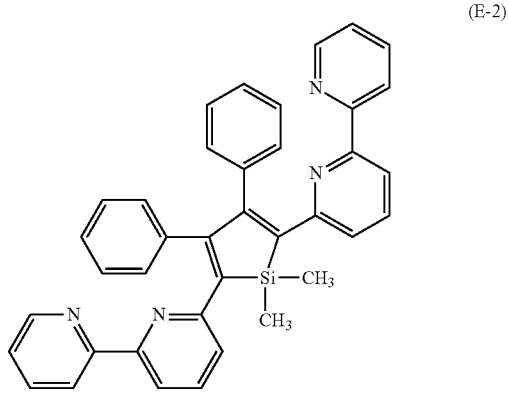

Example 8

In the same manner as in Example 4, except that the imidazole derivative E-3 shown below was used as the electron transporting material having a heteroaryl ring structure containing an electron-accepting nitrogen, a light emitting device was produced. From this light emitting device, red light having high efficiency and high chromatic purity was emitted at luminance efficiency of 4.2 lm/W and chromatility CIE(x, y)=(0.64, 0.36) was emitted. This light emitting device was subjected to DC driving at 40 mA/cm². As a result, a luminance half-decay lifetime was 3,800 hours.

[Chemical Formula 31]

(E-3)

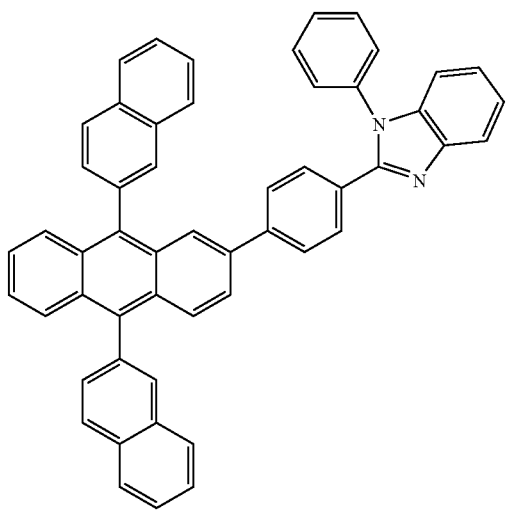

Example 9

In the same manner as in Example 4, except that the pyrromethene compound [71] was used as the dopant material, a light emitting device was produced. From this light emitting device, red light having high efficiency and high chromatic purity was emitted at luminance efficiency of 2.5 lm/W and chromatility CIE(x, y)=(0.63, 0.37) was emitted. This light emitting device was subjected to DC driving at 40 mA/cm². As a result, a luminance half-decay lifetime was 2,000 hours.

Example 10

In the same manner as in Example 4, except that the pyrromethene compound [116] was used as the dopant material, a light emitting device was produced. From this light emitting device, red light having high efficiency and high chromatic purity was emitted at luminance efficiency of 2.2 lm/W and chromatility CIE(x, y)=(0.67, 0.33) was emitted. This light emitting device was subjected to DC driving at 40 mA/cm². As a result, a luminance half-decay lifetime was 2,300 hours.

Example 11

In the same manner as in Example 4, except that the naphthacene compound [125] was used as the host material, a light emitting device was produced. From this light emitting device, red light having high efficiency and high chromatic purity was emitted at luminance efficiency of 3.0 lm/W and chromatility CIE(x, y)=(0.64, 0.36) was emitted. This light emitting device was subjected to DC driving at 40 mA/cm². As a result, a luminance half-decay lifetime was 2,800 hours.

Example 12

In the same manner as in Example 4, except that the naphthacene compound [127] was used as the host material, a light emitting device was produced. From this light emitting device, red light having high efficiency and high chromatic purity was emitted at luminance efficiency of 2.9 lm/W and chromatility CIE(x, y)=(0.64, 0.36) was emitted. This light emitting device was subjected to DC driving at 40 mA/cm². As a result, a luminance half-decay lifetime was 2,200 hours.

Example 13

In the same manner as in Example 4, except that the naphthacene compound [136] was used as the host material, a light emitting device was produced. From this light emitting device, red light having high efficiency and high chromatic purity was emitted at luminance efficiency of 2.5 lm/W and chromatility CIE(x, y)=(0.64, 0.36) was emitted. This light emitting device was subjected to DC driving at 40 mA/cm². As a result, a luminance half-decay lifetime was 2,700 hours.

Example 14

In the same manner as in Example 4, except that the naphthacene compound [141] was used as the host material, light emitting device was produced. From this light emitting device, red light having high efficiency and high chromatic purity was emitted at luminance efficiency of 3.2 lm/W and chromatility CIE(x, y)=(0.64, 0.36) was emitted. This light emitting device was subjected to DC driving at 40 mA/cm². As a result, a luminance half-decay lifetime was 2,800 hours.

INDUSTRIAL APPLICABILITY

The light emitting device material of the present invention has high luminance efficiency and is also excellent in durability. The light emitting device of the present invention can be used for display elements, flat panel displays, backlights, lighting, interiors, marks, signboards, electronic cameras, light signal generators and the like.

The invention claimed is:

1. A light emitting device comprising at least an emissive layer existing between an anode and a cathode, which emits light by means of electric energy, wherein the emissive layer contains at least a compound having a pyrromethene skeletal structure represented by the formula (1) or a metal complex thereof, and a naphthacene derivative represented by the formula (2):

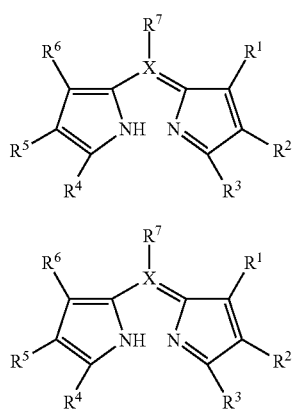

(1)

wherein $R^1$ to $R^7$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents; X represents a carbon atom or a nitrogen atom, and $R^7$ is absent when X is a nitrogen atom; and metal of a metal complex is at least one selected from among boron, beryllium, magnesium, chromium, iron, cobalt, nickel, copper, zinc and platinum:

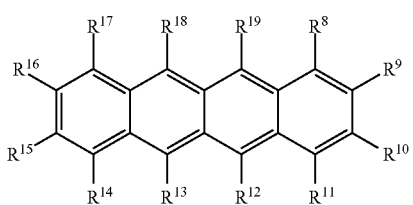

(2)

wherein $R^8$ to $R^{19}$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents, and at least one of $R^8$ to $R^{19}$ in the naphthacene derivative represented by formula (2) is an aryl group.

2. The light emitting device according to claim 1, wherein the metal complex is represented by the following formula (3):

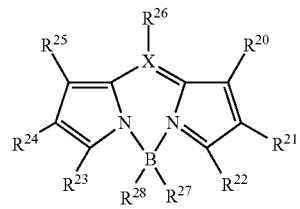

(3)

wherein $R^{20}$ to $R^{26}$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents; $R^{27}$ and $R^{28}$ may be the same or different and are selected from among halogen, hydrogen, an alkyl group, an aryl group and a heterocyclic group; and X represents a carbon atom or a nitrogen atom, and $R^{26}$ is absent when X is a nitrogen atom.

3. The light emitting device according to claim 1, wherein the naphthacene derivative is represented by the following formula (4):

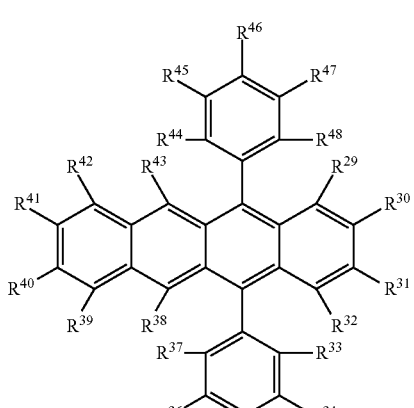

(4)

wherein $R^{29}$ to $R^{48}$ may be the same or different and are selected from among hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, halogen, a cyano group, a carbonyl group, a carboxyl group, an oxycarbonyl group, a carbamoyl group, an amino group, a silyl group, a phosphine oxide group, and a ring structure formed between adjacent substituents.

* * * * *